US007991170B2

(12) United States Patent
Horbach

(10) Patent No.: US 7,991,170 B2
(45) Date of Patent: Aug. 2, 2011

(54) LOUDSPEAKER CROSSOVER FILTER

(75) Inventor: Ulrich Horbach, Agoura Hills, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 1761 days.

(21) Appl. No.: 11/123,449

(22) Filed: May 5, 2005

(65) Prior Publication Data

US 2006/0251272 A1 Nov. 9, 2006

(51) Int. Cl.
*H03G 5/00* (2006.01)

(52) U.S. Cl. .......... 381/99; 381/98

(58) Field of Classification Search .......... 381/98–99, 381/335, 342
See application file for complete search history.

(56) References Cited

U.S. PATENT DOCUMENTS

| | | | | |
|---|---|---|---|---|
| 5,642,429 | A * | 6/1997 | Janssen | 381/182 |
| 6,834,113 | B1 * | 12/2004 | Liljehag et al. | 381/99 |
| 6,834,114 | B2 * | 12/2004 | Kobayashi et al. | 381/396 |
| 7,003,124 | B1 * | 2/2006 | Thiel | 381/99 |
| 2002/0191807 | A1 * | 12/2002 | Asada et al. | 381/335 |
| 2003/0021428 | A1 * | 1/2003 | Abe et al. | 381/97 |

OTHER PUBLICATIONS

Siegfried H. Linkwitz; Active Crossover Networks for Noncoincident Drivers; Jan./Feb. 1976; vol. 24, No. 1.; 7 pages (pp. 2-8).
Joseph A. D'Appolito; A Geometric Approach to Eliminating Lobing Error in Multiway Loudspeakers; Oct. 8-12, 1983; 17 pages.
Brandon Cochenour and David A. Rich; A Virtual Loudspeaker Model to Enable Real-Time Listening Tests in Examining the Audibility of High-Order Crossover Networks; Oct. 10-13, 2003; 13 pages.
Peter L. Schuck and Greg Klowak; Digital FIR Filters for Loudspeaker Crossover Networks; Nov. 3-6, 1988; 32 pages.

* cited by examiner

*Primary Examiner* — Devona E Faulk
*Assistant Examiner* — Disler Paul
(74) *Attorney, Agent, or Firm* — The Eclipse Group LLP

(57) ABSTRACT

A method is provided for computing frequency responses of crossover filters for multi-way loudspeakers. The method prescribes driver coordinates for drivers in the multi-way loudspeaker, prescribes an attenuation function for the sound pressure level at a desired angle, computes the crossover frequencies using a point source model and computes the frequency responses in intervals defined by the crossover frequencies.

19 Claims, 29 Drawing Sheets

1600

LOUDSPEAKER CROSSOVER FILTER

BACKGROUND OF THE INVENTION

1. Field of the Invention

This invention relates generally to crossover filters for use with multi-way loudspeaker systems with non-coincident drivers.

2. Related Art

Crossover filters used in multi-way loudspeaker systems having non-coincident drivers are designed to effectively divide the frequency band into partitions, so that the individual drivers work within the frequency bands for which they were designed, so that distortion is minimized. At the same time, it is highly desirable for the resulting acoustic frequency responses of the whole loudspeaker system to be reasonably flat or smooth within an area, not only at a single point in space. Typically, it has not been possible to achieve a reasonable flat or smooth frequency response within an area due to the required spacing between the drivers. Drivers typically have to be spaced apart due to their physical size. The amount of required spacing usually compares with the wavelength of the radiated sound. This required physical spacing causes interferences due to different path lengths of sound waves traveling from the drivers to the considered point in space. Attempts have been made to address these problems; however, past attempts have not overcome all disadvantages.

By way of example, FIG. 1 illustrates a typical, four-way loudspeaker that is known in the art. The four drivers are connected to four crossover filters $H_0, \ldots, H_3$. The first driver $D_0$ has a membrane diameter of approximately 0.015 m and is located at the origin $x_0$ of the loudspeaker. The second driver D1 employs a membrane of approximately 0.030 m in diameter and is located at $x_1=0.06$ m. The third driver D2 measures approximately 0.11 m in membrane diameter and is located at $x_2=0.17$ m, while the forth driver D3 is approximately 0.30 m in membrane diameter and located at $x_3=0.40$ m.

One known and suggested filtering method for use in multi-way loudspeakers, such as the prior art loudspeaker illustrated in FIG. 1, is the $4^{th}$ order "Linkwitz-Riley" crossover filters. FIG. 2 illustrates the frequency response of $4^{th}$ order Linkwitz-Riley crossover filters $H_0, \ldots, H_3$ employed in prior art loudspeaker illustrated in FIG. 1. As employed with the prior art drivers shown in FIG. 1, the crossover frequencies would be typically 100 Hz, 600 Hz, and 2500 Hz, as illustrated by FIG. 2. The filters may be implemented both as analog or digital filters. To determine the acoustic frequency responses of the loudspeaker using $4^{th}$ order Linkwitz-Riley crossover filters, a model employing ideal flat, circular membranes and pistonic motion, may be used. The frequency responses may be determined at vertical displacement angles of 0 to 45 degrees (0 . . . 45) in 5 degree steps, simulated upward and downward, respectively, relative to the main axis which is perpendicular to x=0.

FIG. 3 illustrates the resulting frequency responses, at vertical displacement angles 0 . . . 45 degrees in 5 degree steps, simulated positive upwards relative to the main axis which is perpendicular to x=0. FIG. 4 illustrates the resulting frequency responses, at vertical displacement angles 0.45 degrees in 5 degree steps, simulated negative downwards relative to the main axis which is perpendicular to x=0. As illustrated by FIGS. 3 & 4, the simulation illustrates that interferences around the crossover points cause large deviations from the desired flat response curves out of the main axis. Thus, employing the $4^{th}$ order Linkwitz-Riley crossover filters does not achieve the desired flat frequency responses over the area of interest.

More recently, the use of $4^{th}$ order Chebychev filters has been recommended with a prescribed stopband attenuation and flat passband. FIG. 5 illustrates the frequency responses of prior art $4^{th}$ order "Chebychev Notched" crossover filters $H_0, \ldots, H_3$ with a stopband attenuation of 30 db and flat passband employed in the prior art loudspeaker of FIG. 1. Applying the Chebychev filters to the prior art loudspeaker of FIG. 1 with a stopband attenuation of 30 db, the simulated frequency responses also reveal problems with the use of the $4^{th}$ order Chebychev filters. FIG. 6 illustrates the resulting frequency responses, at vertical displacement angles 0 . . . 45 degrees in 5 degree steps, simulated positive upwards relative to the main axis which is perpendicular to x=0. FIG. 7 illustrates the resulting frequency responses, at vertical displacement angles 0 . . . 45 degrees in 5 degree steps, simulated negative downwards relative to the main axis which is perpendicular to x=0. As illustrated by FIGS. 6 & 7, although the error regions are narrowed and thus less audible, deviation still exists around the cross over points and thus does not achieve the desired flat frequency responses over the desired area.

Yet another alternative is to use digital, linear phase finite impulse response ("FIR") filters with very narrow transition bands. FIG. 8 illustrates the frequency responses of digital, linear phase FIR filters $H_0, \ldots, H_3$ with very narrow transition bands employed in the prior art loudspeaker of FIG. 1. By applying FIR filters to the FIG. 1, prior art loudspeaker, it is determined by simulating the measured frequency response of these filters that the upward and downward responses are now identical, because the filters introduce no phase distortion. Additionally, the widths of the transition regions are also minimized. However, the directivity characteristics of the individual drivers result in non-uniform out-of-axis frequency responses. These shortfalls are demonstrated by FIG. 9 which illustrates the simulated acoustic far field frequency responses at vertical angles 0 . . . 45 degrees in 5 degree steps, upwards and downwards with respect to tweeter axis, using crossover filters of FIG. 8.

Finally, d'Appolito proposes a symmetric arrangement of two midrange drivers around a center tweeter to reduce lobing errors. To employ d'Appolito's proposal the prior art loudspeaker illustrated in FIG. 1 must be extended, as illustrated in FIG. 10, to have a center tweeter at $x_0$, two first midranges at $+/-x_1$, two further woofer/midranges at $+/-x_2$, and two woofers at $+/-x_3$ symmetrically arranged with respect to the center tweeter at $x_0$. FIG. 11 illustrates the frequency responses of the crossover filters $H_0, \ldots, H_3$ using $3^{rd}$ order Butterworth crossover filters as suggested by d'Appolito with the symmetric arrangement illustrated in FIG. 11. FIG. 12 illustrates the simulated acoustic far field frequency responses at vertical angles 0 . . . 45 degrees in 5 degree steps, upwards and downwards with respect to tweeter axis, using loudspeaker system of FIG. 10 and crossover filters of FIG. 11. As illustrated by FIG. 12, the loudspeaker system now becomes directive over larger frequency bands, which is desirable in most cases; however, the directivity is not constant over frequency.

Therefore, a need exists for a filtering method and systems for use with multi-way loudspeakers that are designed to effectively divide the frequency band into partitions, so that distortion is minimized and that also produce resulting acoustic frequency responses that are reasonably flat or smooth within an area, thus overcoming the disadvantages set forth above and others previously experienced.

SUMMARY

According to one example implementation of the invention, a method is provided for computing frequency responses of crossover filters for multi-way loudspeakers. The method provides for setting an attenuation factor for the sound pressure level of the loudspeaker at a desired angle. Crossover frequencies are then computed using a point source model. Frequency responses may then be computed in an interval defined by the crossover frequencies.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

Figure 13:
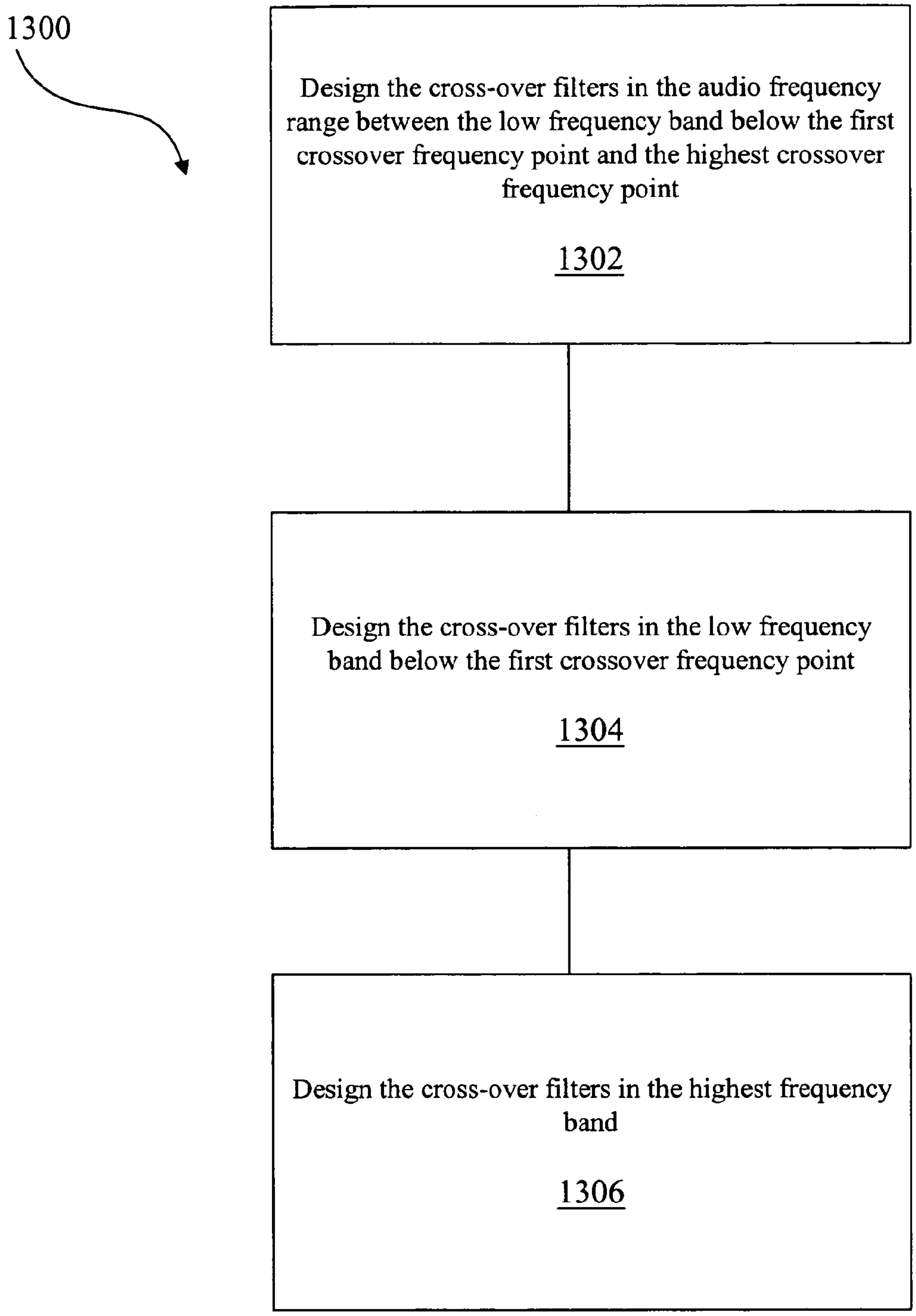
FIG. 13 illustrates a flow diagram of a new method for designing crossover filters for multi-way loudspeaker systems.

FIG. 13 illustrates a flow diagram 1300 of a method for designing crossover filters for multi-way loudspeaker systems. As illustrated in FIG. 13, the first step 1302 is to design the crossover filters in the audible frequency range between the lowest crossover frequency point and the highest cross-over frequency point. The second step 1304 is to design the cross-over filters in the low frequency band below the first crossover frequency point. Third step 1306 is to design the cross-over filters in the highest frequency band. Those skilled in the will recognize that the performance of the second step and the third step are interchangeable in that it is not necessary to perform the second step 1304 and before the third step 1306. Once the filter designs are determined, the linear phase filter coefficients for each FIR filter in a signal path may be computed using the Fourier frequency sampling method or other approximation method.

I. Design the Cross-Over Filters in the Audible Frequency Range Between the Lowest Crossover Frequency Point and the Highest Crossover Frequency Point.

Figure 14:
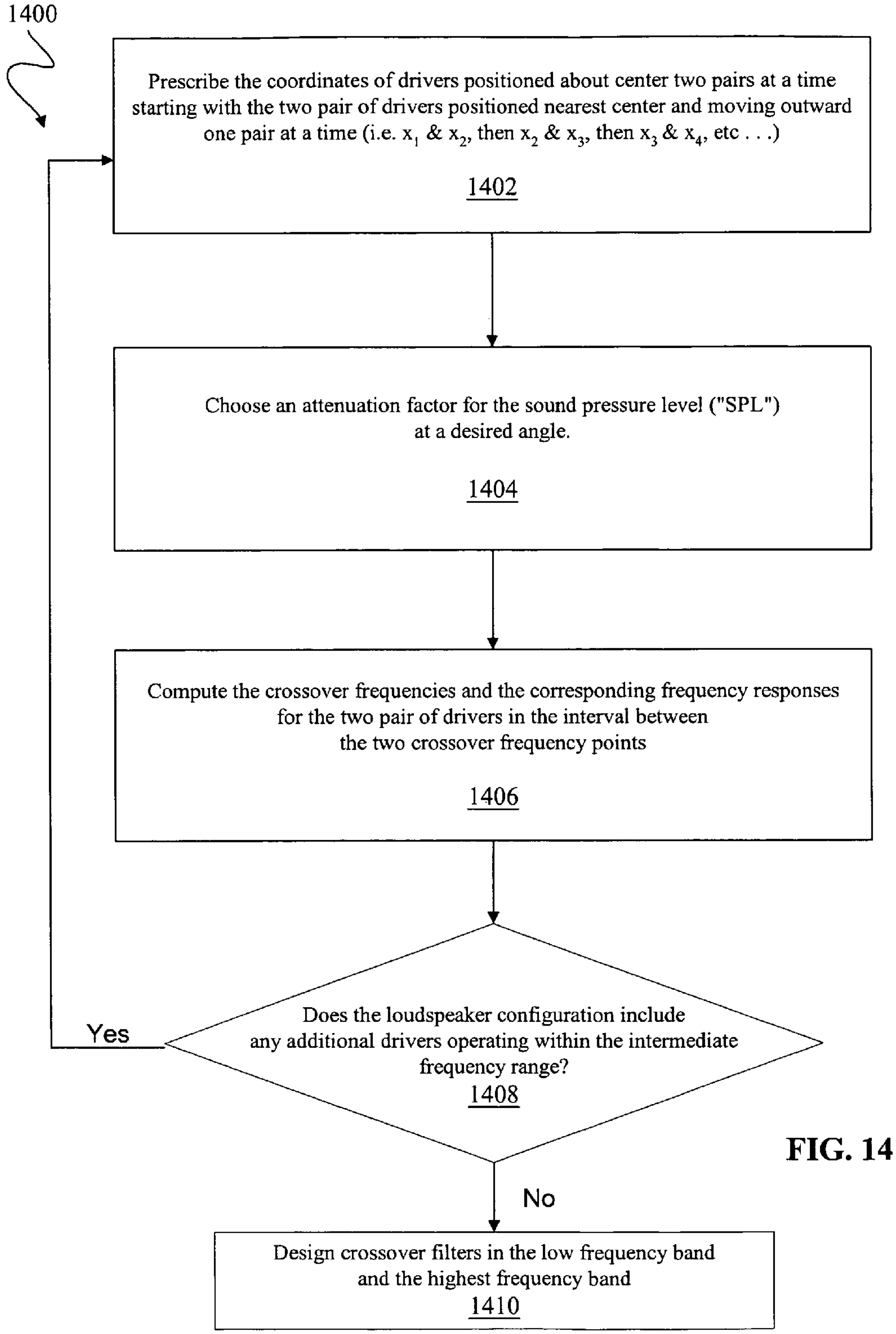
FIG. 14 illustrates a flow diagram that sets forth the method for determining the filter coefficients for the crossover filters in the audio frequency range between the lowest crossover frequency point and the highest crossover frequency point in the audible frequency range.

FIG. 14 illustrates a flow diagram 1400 that sets forth the method for determining the filter coefficients for the cross-over filters in the audible frequency range between the lowest crossover frequency point and the highest crossover frequency point, which may be referred to as the "intermediate frequency range". Further, for purposes of this application, the crossover filters within the intermediate frequency range may be referred to as the "midrange crossover filters." The first step 1402 is to determine the coordinates of the two nearest pairs of drivers positioned about center. The initial positions or design configuration of the speaker and drivers may be designed in accordance with a number of different variables, depending upon the application, such as the desired size of the speaker, intended application or use, manufacturing constraints, aesthetics or other product design aspects. The second step 1404 is to choose an attenuation factor for the sound pressure level ("SPL") at a desired angle. The next step 1406 is to compute the crossover frequencies $f$ and the frequency responses $w(f)$ between the crossover frequency intervals $f$ for the drivers.

As illustrated in step 1408 of FIG. 14, this process is then repeated for the next two pairs of drivers positioned about center moving outward only one pair at a time, i.e. by increasing the driver index i by one, starting with i=1. For example, where the loudspeaker system has four pairs of drivers positioned about center operating within the intermediate frequency range, the crossover frequencies $f$ and frequency responses $w(f)$ between the crossover frequency intervals $f$ for the drivers are calculated first for $(x_1, -x_1, x_2, -x_2)$ then repeated for $(x_2, -x_2, x_3, -x_3)$ and then for $(x_3, -x_3, x_4, -x_4)$.

As illustrated by step 1410, once all crossover filters in the intermediate frequency band are designed, the crossover filters in the low frequency band and the highest frequency band need to be designed. The design of the crossover filters in the intermediate frequency band is further described below.

Although FIG. 14 describes the process in an iterative manner, it is not necessary that the process described above be applied iteratively. Rather, the process for determining the crossover frequencies within the intermediate frequency band may begin by determining the crossover frequencies for any two neighboring coordinate pairs of drivers operating within the intermediate band. The application of the process in a non-iterative manner is demonstrated below by applying the process first to the drivers at coordinates $(x_3, -x_3, x_4, -x_4)$ in a six-way speaker, an example of which is demonstrated below in FIG. 15.

Figure 15:
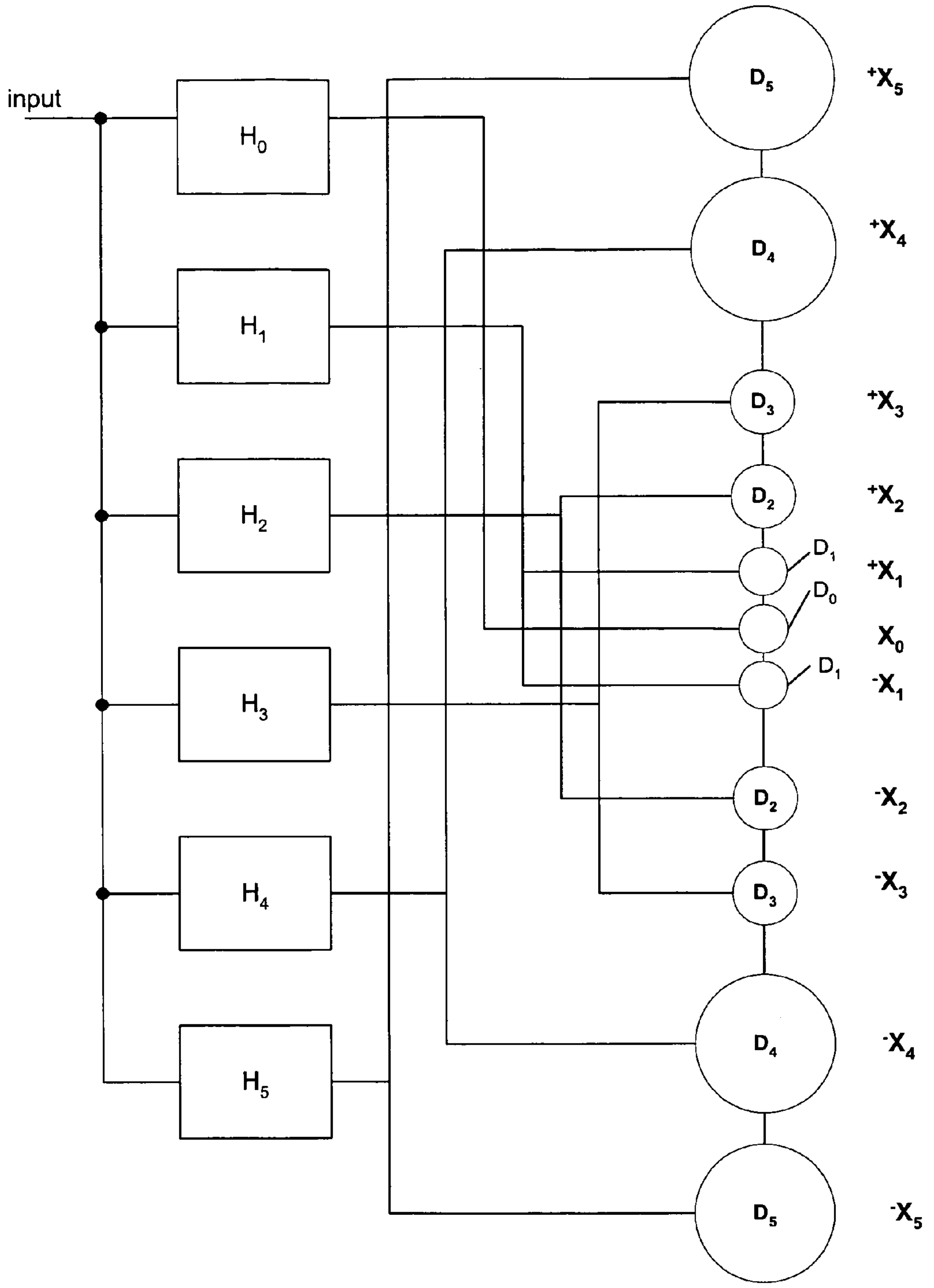
FIG. 15 is an example of a six-way loudspeaker system with crossover filters $H_0, \ldots, H_5$ and driver coordinates $x_0$, $+/-x_1$, $+/-x_2$, $+/-x_3$, $+/-x_4$, $+/-x_5$ drivers arranged pair wise symmetrically with respect to center tweeter.

A. Prescribe the Coordinates of Two Pairs of Drivers Positioned about Center Starting with the Two Pair Nearest Center By way of example, crossover filters can be designed according to the method of the invention for the configuration of a six-way loudspeaker array illustrated in FIG. 15. As illustrated by FIG. 15, the six-way loudspeaker includes six-filters $H_0 \ldots H_5$, a center tweeter $D_0$ positioned at $x_0$ and five pairs of drivers $D_1 \ldots D_5$ positioned at $\pm x_1, \pm x_2, \pm x_3, \pm x_4, \pm x_5$. As mentioned above, the first step 1402 of FIG. 14 in designing the filters in the audible frequency range between the lowest crossover frequency point and the highest crossover frequency point is to determine the coordinates of the next two pairs of drivers positioned about the center. In this example, we prescribe two coordinate pairs $(x_{3.}, -x_{3.}, x_{4.}, -x_4)$ for the two pairs of transducers that are symmetrically positioned with respect to the origin along an x-axis with the indices i=3 and i=4.

Using this example, the coordinates may be $x_3$=0.22 m, $x_4$=0.45 m or (0.22, −0.22, 0.45, −0.45). These coordinates denote the center coordinates of the respective transducers, which can be tweeters, midrange drivers or woofers. In the origin is a single tweeter, the filter design for which is described below in Section III below, which discusses how to determine the filter coefficients for the cross-over filters in the highest frequency band.

B. Choose an Attenuation Factor for the Sound Pressure Level ("SPL")

Next, as set forth in step 1404 of FIG. 14, an attenuation factor a and an angle $\alpha$ is established. The factor a specifies the amount by which the sound pressure level ("SPL"), observed at the angle $\alpha$, shall be attenuated, with respect to the SPL observed on the axis perpendicular to the origin at an observation point P. The observation point P must be much farther away than the maximum physical extension of the loudspeaker, i.e., far field observation.

Figure 16:
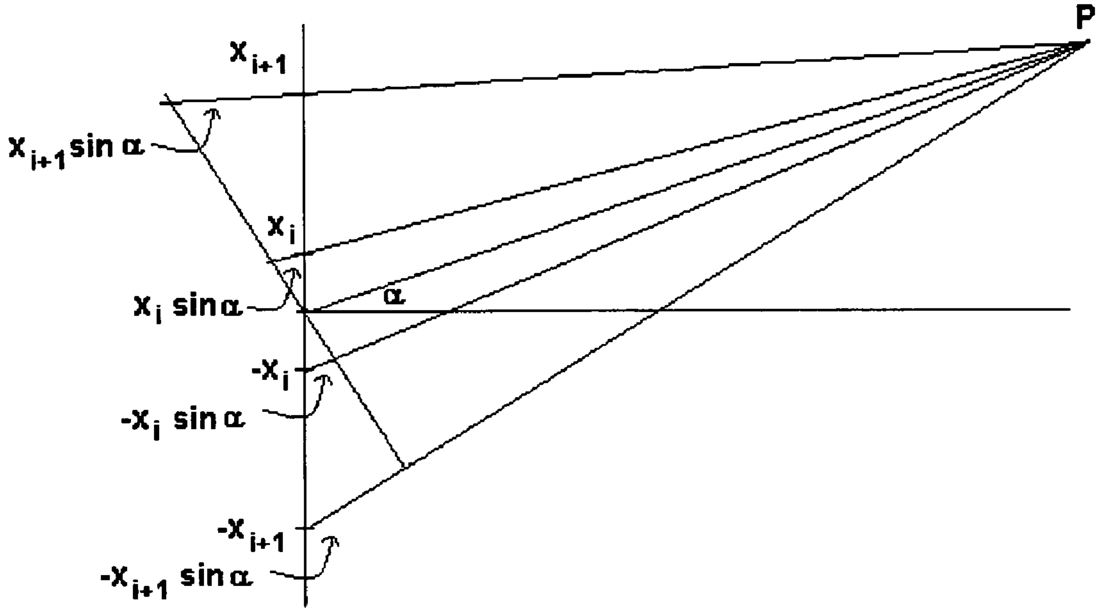
FIG. 16 illustrates a computation of path differences for the two pairs of acoustic sources at $+/-x_i$ and $+/-x_{i+1}$, as illustrated in FIG. 15, at a far field observation point P, and an observation angle $\alpha$, using point source models for the drivers.

FIG. 16 illustrates a computation of path differences for the two pairs of acoustic sources at $+/-x_i$ and $+/-x_{i+1}$, as illustrated in FIG. 15, at a far field observation point P, and an observation angle $\alpha$. In this example, the initial coordinates for a and $\alpha$ may be set as follows: a=0.35, $\alpha$=40° (forty degrees).

C. Compute the Crossover Frequencies $f$ and the Frequency Responses $w(f)$ in the Frequency Interval for the Drivers Defined by the Crossover Frequencies Once the initial parameters for the coordinates of the drivers and the attenuation factor a and angle $\alpha$ are chosen, as set forth in FIG. 14 step 1406, the crossover frequencies $f_{i-1}$ and $f_i$, also called crossover frequency points, and the crossover frequency responses $w(f)$ between the frequency interval specified by crossover frequency points $f_{i-1}$ and $f_i$ are computed. The crossover frequencies and the frequency response between the crossover frequencies can be computed as set forth below.

Let the input signal pass a first crossover filter having magnitude frequency response $w(f)$, the output of which feeds transducer located at $x_i$, and a complementary second filter having frequency response 1-$w(f)$, feeding the transducer located at $x_{i+1}$. This ensures that the acoustic sound pressure sum equals one on-axis, independent of frequency, provided both filters and transducers are (approximately) linear phase systems. We obtain the total sound pressure H at the observation point P as $$H(f)=w(f)\cdot C_{i+1}(f)+(1-w(f))\cdot C_i(f) \quad \text{(Equation 1)}$$

$$\text{with } C_{i/i+1}(f)=2\cdot\cos(2\pi\cdot d_{i/i+1}/\lambda) \quad \text{(Equation 2)}$$

with the acoustical wavelength $$\lambda = \frac{c}{f},$$

c=346 m/sec, i.e., speed of sound and $$d_{i/i+1} = x_{i/i+1} \cdot \sin\alpha \quad \text{(Equation 3)}$$

are the path difference between the corresponding transducers and the point of origin, as illustrated in FIG. 15. Equation 2 is the result of summing two ideal acoustic point sources, as known to someone skilled in the art.

Setting $H(f)=a$, where a is the attenuation factor, and using Equation 1, results in $$w(f) = \frac{a - C_i(f)}{C_{i+1}(f) - C_i(f)} \quad \text{(Equation 4)}$$

The upper crossover frequency is approached where $w(f)$ becomes zero, that is $a=C_1(f)$. Using Equation 2 gives the result $$f_{i-1} = \cos^{-1}(a) \cdot \frac{c}{2\pi \cdot x_i \sin\alpha} \quad \text{(Equation 5)}$$

Accordingly, in order to achieve a seamless transition to the previous frequency band, we have $$f_i = \cos^{-1}(a) \cdot \frac{c}{2\pi \cdot x_{i+1} \sin\alpha} \quad \text{(Equation 6)}$$

Figure 17:
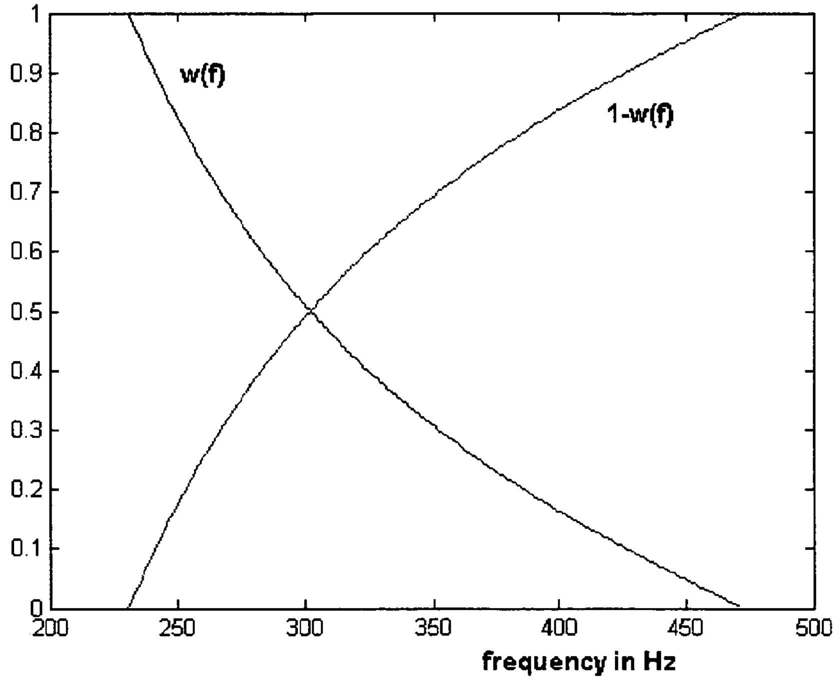
FIG. 17 illustrates the typical crossover functions w(f) and 1-*w*(*f*) in an intermediate frequency band according to one example embodiment of the invention.
Figure 21:
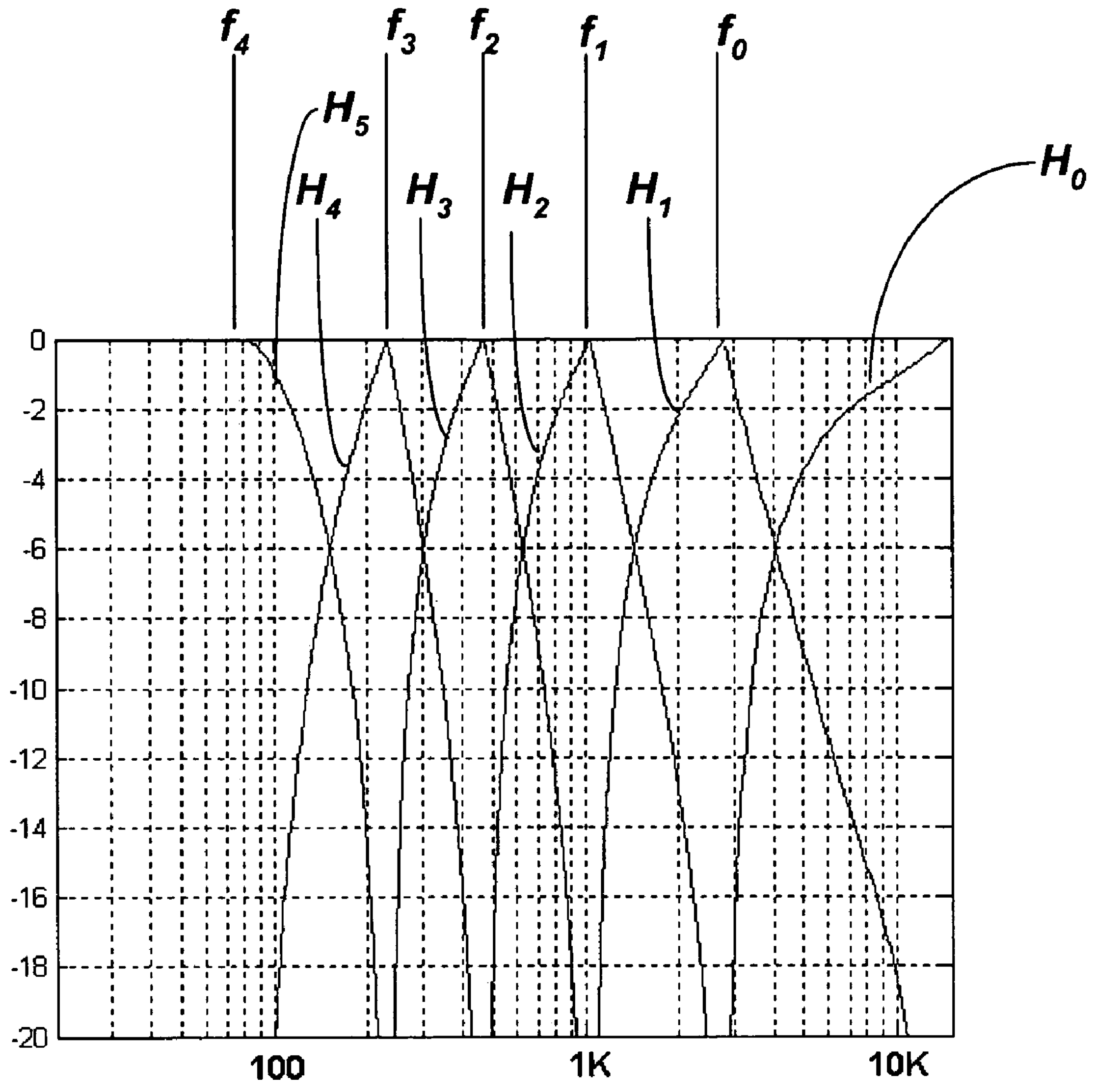
FIG. 21 illustrates the frequency responses of the digital, FIR linear phase crossover filters illustrated in FIG. 15.

FIG. 17 illustrates the typical crossover functions w(f) and 1-*w(f)* in an intermediate frequency band according to Equation 4. Using the example parameters of the example embodiment, setting the initial parameters as a=0.35, α=40° (forty degrees), i=3, $x_3$=0.22 m, $x_4$=0.45 m. The crossover frequencies are $f_2$=472 Hz, $f_3$=231 Hz, as determined in accordance with Equations 5 and 6, set forth above and as illustrated by FIG. 21 below.

D. Increase Driver Index i by one and Repeat Procedure for Design of Crossover Filters until Design is Complete for all Drivers Operating in the Intermediate Frequency Range As illustrated by step 1408 of FIG. 14, the above method for designing crossover filters is repeated for all remaining pairs of drivers. For example, where the loudspeaker system has five pairs of drivers positioned about center operating within the intermediate frequency range, as illustrated in FIG. 15, the crossover frequencies $f$ and frequency responses $w(f)$ between the upper and lower crossover frequencies for the drivers should be calculated for ($x_1$, $-x_1$, $x_2$, $-x_2$), ($x_2$, $-x_2$, $x_3$, $-x_3$), ($x_3$, $-x_3$, $x_4$, $-x_4$) and ($x_4$, $-x_4$, $x_5$, $-x_5$). As illustrated in FIG. 14, step 1410, once the crossover frequencies for the driver operating in the intermediate band are calculated, the crossover filters for the high frequency and low frequency may be designed.

II. Determine the Filter Coefficients for the Low Frequency Crossover Filter

Once the crossover filters are designed in the audible frequency range between the lowest crossover frequency point and the highest crossover frequency point, as set forth in step 1302 of FIG. 13, the filter coefficients for the low frequency crossover filters, as set forth in step 1304 of FIG. 13, and the high frequency crossover filters, as set forth in step 1306 of FIG. 13, must then be determined. As stated previously, either the high frequency or low frequency filter coefficient may be determined once the midrange filter coefficients are determined. For purposes of this application, we will discuss the design of the filter coefficients for the low frequency crossover filter first, in accordance with step 1304 of FIG. 13.

An array of any kind has a transition frequency below which it approaches omnidirectional radiation characteristics. This occurs where the wavelength of radiated sound becomes much larger than the array's physical dimensions. Accordingly, forcing sound attenuation at an off-axis angle to a constant value a, as described in Section I above to determine the filter coefficients for the cross-over filters in the audible frequency range between the lowest crossover frequency point and the highest crossover frequency point does not provide as useful of results for the first frequency band as other methods for determining filter coefficients, such as prescribing a non-constant target function as set forth below.

Below the first crossover frequency point $f_{n-2}$, which is $f_4$ for the (n=6)-way loudspeaker configuration of FIG. 15 as determined in Section I above, when designing the midrange crossover frequencies, only one pair of outer drivers is active, fed by filter $H_{n-1}$, which is $H_5$ in FIG. 15. The sound pressure is therefore $$a^{(0)}(f) = 2 \cdot \cos(2\pi \cdot d_{n-1}/\lambda) \quad \text{(Equation 7)},$$

compare to Equation 2 in Section 1 above, where $d_{n-1}$ is the coordinate of woofer n−1. Above crossover frequency $f_3$, i.e., $f_{n-3}$, the target function $a^{(2)}(f)$=a=const., as set forth in Section I above.

Figure 18:
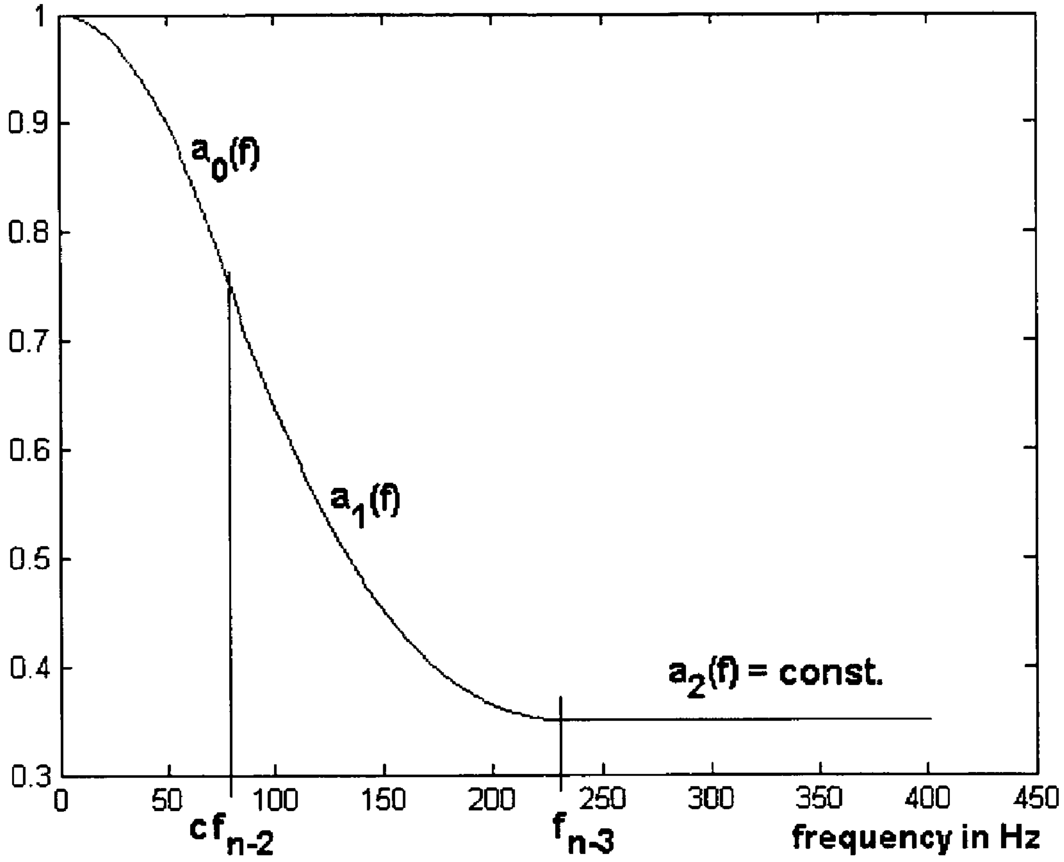
FIG. 18 illustrates the typical target directivity functions $a_0(f)$ and $a_1(f)$ for the first frequency band 0 . . . $f_1$ according to one example embodiment of the invention.

Below the first crossover frequency point $f_{n-3}$, which is $f_3$ for the loudspeaker configuration of FIG. 15 as determined in Section I above, we modify the crossover frequency $f_{n-2}$, referred to as modified by $$cf_{n-2} \quad \text{(Equation 8)}$$

by multiplying $f_{n-2}$ by a factor c<1 (typically c=0.3 . . . 0.7). A transition curve $a^{(1)}(f)$ can be constructed for the frequency interval $cf_{n-2} \ldots f_{n-3}$ using a cubic spline function, which may be performed by a function "spline" that is part of the Matlab® software package, owned and distributed by The MathWorks, Inc. Similar methodologies and/or functions may be used to construct a transition curve for the frequency interval. FIG. 18 shows an example of a complete target function $a(f)$ for the first frequency band composed of the parts $a^{(0)}(f)$, $a^{(1)}(f)$ and $a^{(2)}(f)$, as explained above, where $a^{(2)}(f)$ is a constant in accordance with the method for determining the coefficients of the midrange crossover filters as set forth in Section I above.

The same methods for computing the crossover filters $w(f)$ for the midrange filters, as described in Section I above may be used to compute the low frequency filters except that a frequency-dependent target function, as illustrated in FIG. 18, is used, such that Equation 4 becomes Equation 9, replacing a constant attenuation with the frequency dependent attenuation where $a(f)=a^{(1)}(f)$:

$$w(f) = \frac{a(f) - C_i(f)}{C_{i+1}(f) - C_i(f)}. \quad \text{(Equation 9)}$$

Figure 19:
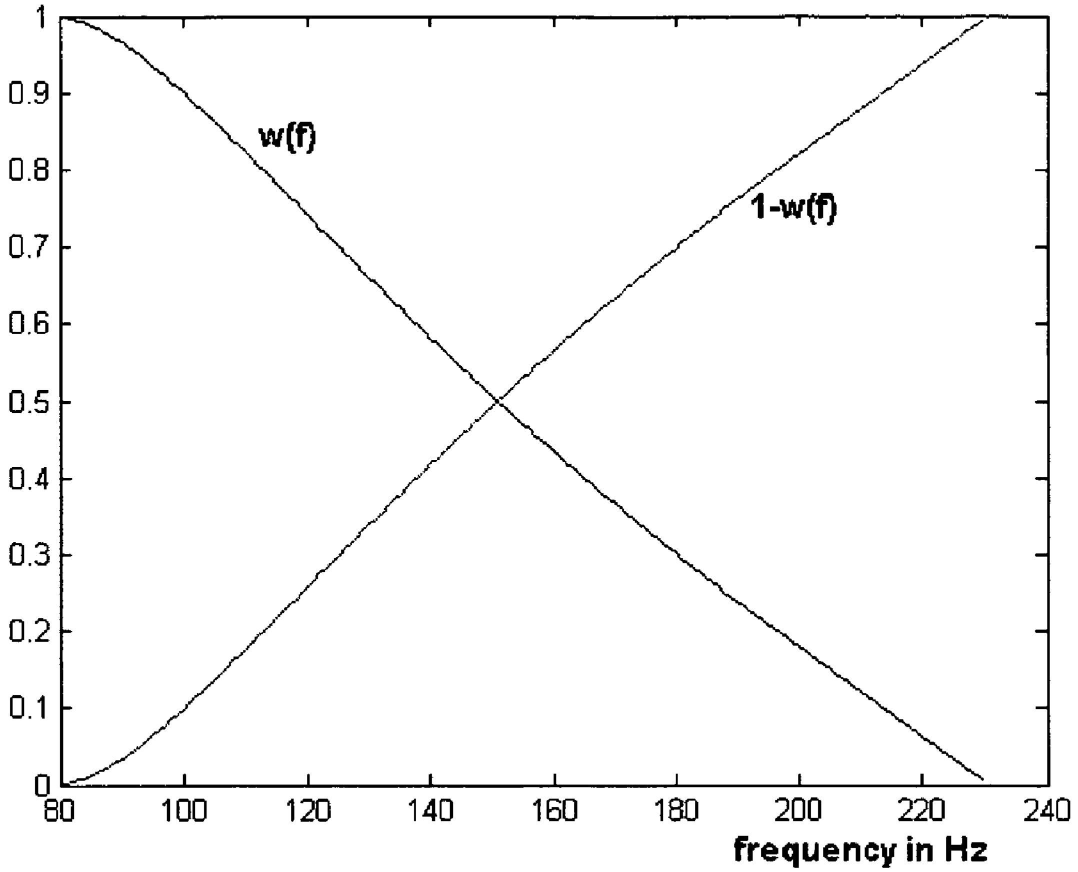
FIG. 19 illustrates the typical crossover functions w(f) and 1-*w*(*f*) in the first, low frequency band according to one example embodiment of the invention.

Applying Equation 9 with the initial parameters for $a^{(2)}(f)$ as set forth in Section I above at a=0.35, α=40 degrees, $x_4$=0.45 m, $x_5$=0.78 m, and $f_3$=231 Hz the following results c=0.6, $cf_4$=80 Hz may be found. These results are reflected in FIG. 19, which is illustrates the typical crossover functions w(f) and 1-*w*(*f*) in the first, low frequency band according to one example of an embodiment of the invention.

III. Determine the Filter Coefficients for the High Frequency Crossover Filter

Once the crossover filters are designed in the audible intermediate frequency ranges and low frequency range, the crossover filters for the highest crossover points, as set forth in step 1306 of FIG. 13, must be designed. The directional properties in the highest frequency band are determined by the properties of the center tweeters at x=0, and the first tweeter pair around the center at $x=x_1$ (see FIG. 15). The properties can be modeled or measured, and described by an angle dependent frequency response $H_{tweet}(f, \alpha)$, which must be normalized such that $H_{tweet}(f, \alpha=0)=1$.

An example for obtaining the frequency response $H_{tweet}(f, \alpha)$ by modeling rather than measuring is the simple pistonic model for a driver of membrane diameter d:

$$H_{tweet}(f, \alpha) = \frac{2 \cdot J_1(u)}{u},$$

with $u=2\pi d(f/c)\sin(2\pi\alpha)$, c=speed of sound, $J_1$=first order Bessel function of the first kind.

An iterative search procedure to determine the crossover function w(f) may be applied to the high frequency band only, as set forth below. First, linearly discrete frequency points in the upper frequency band must be identified according to $f_n=f_0+n/N(f_g-f_0)$, n=1 . . . N, $f_0$=highest crossover frequency from the application of the process described above to $(x_1, -x_1, x_2, -x_2)$ (i.e., i=1, equation 5), $f_g$=upper limit of the approximation band which, in one example, may be the upper limit of the audible band (typically N=100, $f_g$=20 kHz).

For each discrete frequency point, we find the value of the crossover function $w(f_n)$ by minimizing the mean squared error $$e=(H(f_n,\alpha=\alpha_0)H_{tweet}(f_n,\alpha=\alpha_0)-a)^2+(H(f_n,\alpha=0)-1)^2 \quad \text{(Equation 10)}$$

Figure 20:
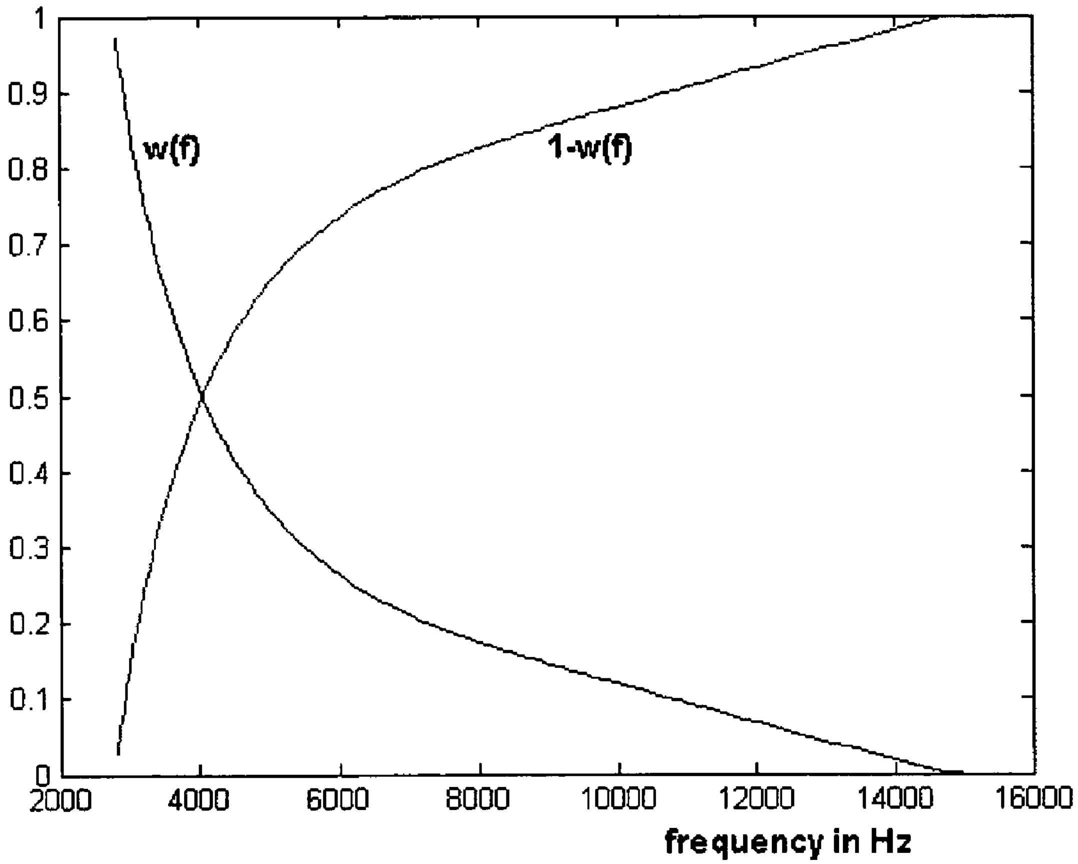
FIG. 20 illustrates the typical crossover functions w(f) and 1-*w*(*f*) in the last, high frequency band, according to the invention.

H (f, α) is the sound pressure at the out-of-axis observation point, a and $\alpha_0$ are prescribed attenuation constant and angle as used in the mid band design. The first term in the right side of Equation (10) forces the attenuation to reach the desired value at the selected angle, the second term ensures a flat frequency response on axis. The minimization can be performed using the Matlab function "fminbnd" that is part of the Matlab® software package, owned and distributed by The MathWorks, Inc. FIG. 20 illustrates the typical crossover functions w(f) and 1-*w*(*f*) in the last, high frequency band according to one example of an embodiment of the invention.

IV. Determine the FIR Filter Coefficients for the Crossover Filters

Once the crossover filters are designed for the audible frequency range, the FIR filter coefficients for the crossover filters may be determined. One method for determining the FIR coefficients is to use a Fourier approximation (frequency sampling method), to obtain linear phase filters of given degree. When applying the Fourier frequency sampling, or other approximation method, a degree should be chosen such that the approximation becomes sufficiently accurate. The Fourier approximation method may be performed by a function "fir2," that is part of the Matlab® software package, owned and distributed by The MathWorks, Inc.

Additionally, with respect to all FIR filters in the loudspeaker array, not just the high frequency filters, modifications can be made to the FIR filters to equalize the measured frequency response of one or more drivers (in particular tweeters, midranges). The impulse response of such a filter can be obtained by well-known methods, and must be convolved with the impulse response of the linear phase channel filter when determining the FIR filter coefficients, as described above. Further, the voice coils (acoustic centers of the drivers) may not be aligned. To compensate for this, appropriate delays can be incorporated into the filters by adding leading zeros to the FIR impulse response.

In an application with n ways, where n=6 using the loudspeaker depicted in FIG. 15 as an example, there are n−1 crossover frequencies $f_0 \ldots f_{n-2}$ or five crossover frequencies. FIG. 21 illustrates the five crossover frequencies of the filters for the loudspeaker depicted in FIG. 15. The low frequency band occurs below the crossover frequency point $f_3$ and is processed by low pass filter $H_5$ of FIG. 15. The first intermediate frequency band occurs between the crossover frequency point $f_4$ and the crossover frequency point $f_2$ which is processed by the band pass filter $H_4$ of FIG. 15. The second intermediate frequency band occurs between the crossover frequency point $f_3$ and the crossover frequency point $f_1$ which is processed by the band pass filter $H_3$. The third intermediate frequency band occurs between the crossover frequency point $f_2$ and the crossover frequency point $f_0$ which is processed by the band pass filter $H_2$. The forth intermediate frequency band occurs between the crossover frequency point $f_1$ and the band limit frequency point $f_g$ (not shown) which is processed by the band pass filter $H_1$. The high frequency band occurs above the crossover frequency point $f_0$ which is processed by high pass filter $H_0$ of FIG. 15.

Figure 22:
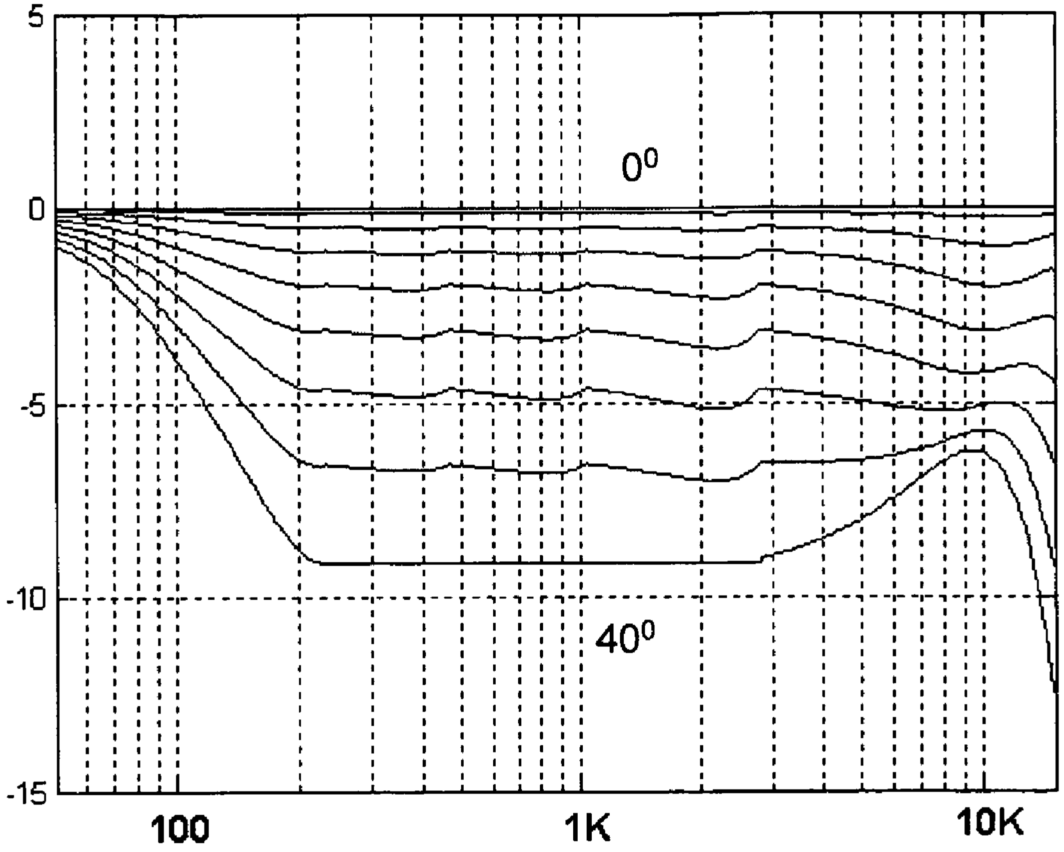
FIG. 22 illustrates the simulated acoustic far field frequency responses at vertical angles 0.40 degrees in 5 degree steps, upwards and downwards with respect to tweeter axis, using loudspeaker system of FIG. 15 and crossover filters of FIG. 21.

Using the method described above and the parameters a=0.35, α=40, x=[0.78 0.45 0.22 0.10 0.04] m, f=[80 231 472 1040 2800] Hz the filter coefficients can be calculated to achieve the vertical out-of-axis frequency response show in FIG. 22, which illustrates the simulated acoustic far field frequency responses at vertical angles 0 . . . 40 degrees in 5 degree steps, upwards and downwards with respect to tweeter axis, using six-way loudspeaker array system. As shown in FIG. 22, the FIR filters of the loudspeaker yield nearly constant directivity characteristics of the loudspeaker system, as desired.

IV. Other Example Implementations

The application of the above described method for determining digital FIR crossover filter coefficients is not limited to loudspeaker array configurations, such as that illustrated by FIG. 15. Those skilled in the art will recognize that the same method may be used to determine filter coefficients for cross over frequencies for loudspeaker arrays with driver configurations differing from that illustrated in FIG. 15. For example, the same methodology can be applied to a four-way digital, FIR linear phase crossover filter bank.

Figure 1:
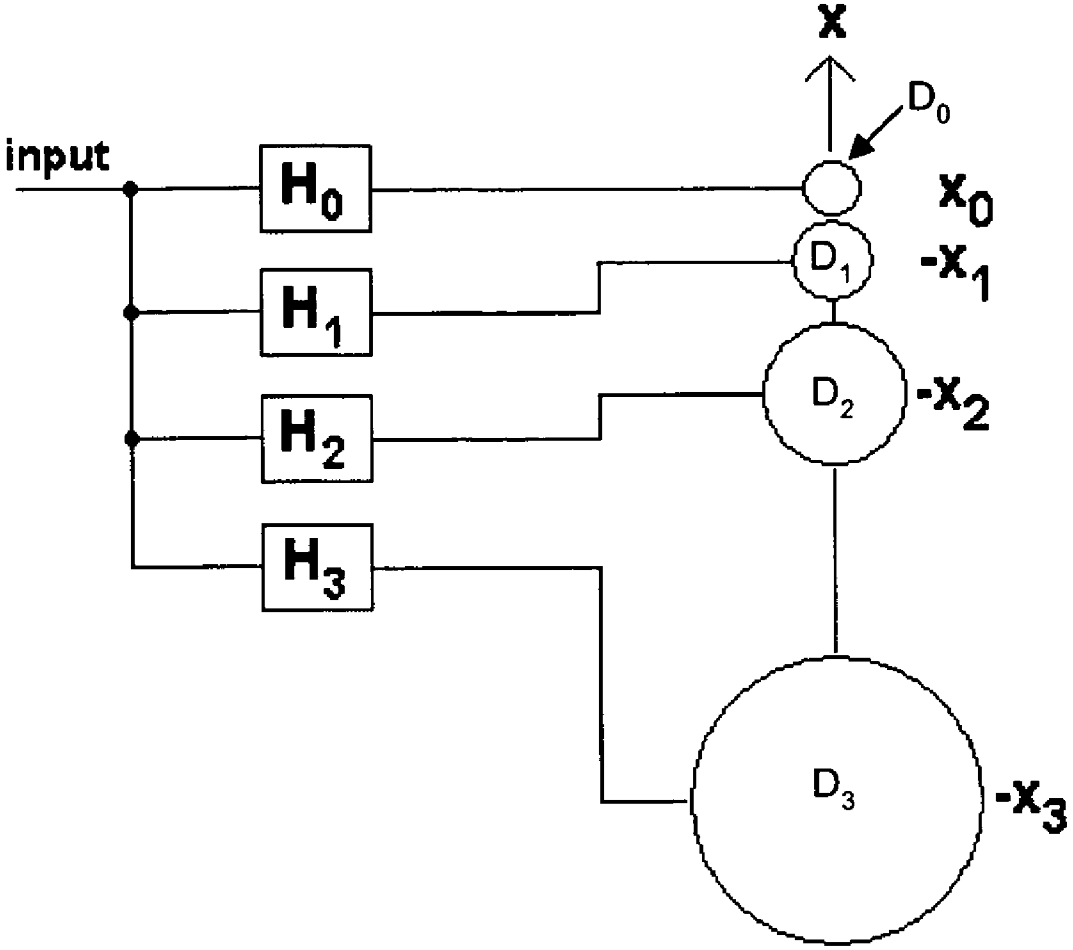
FIG. 1 Prior Art
FIG. 1 is an example of a prior art four-way loudspeaker system.
Figure 2:
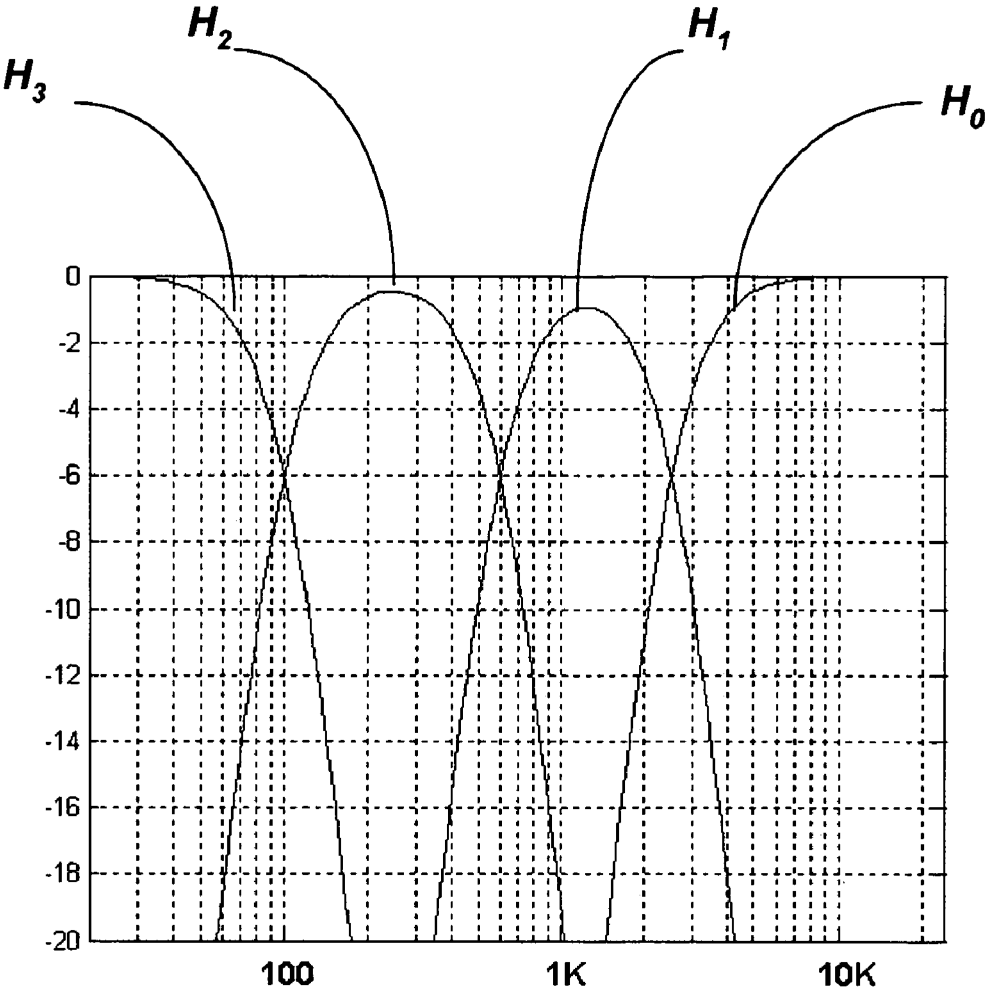
FIG. 2 Prior Art
FIG. 2 illustrates the frequency responses of prior art $4^{th}$ order Linkwitz-Riley crossover filters $H_0, \ldots, H_3$ employed in prior art loudspeaker illustrated in FIG. 1.
Figure 3:
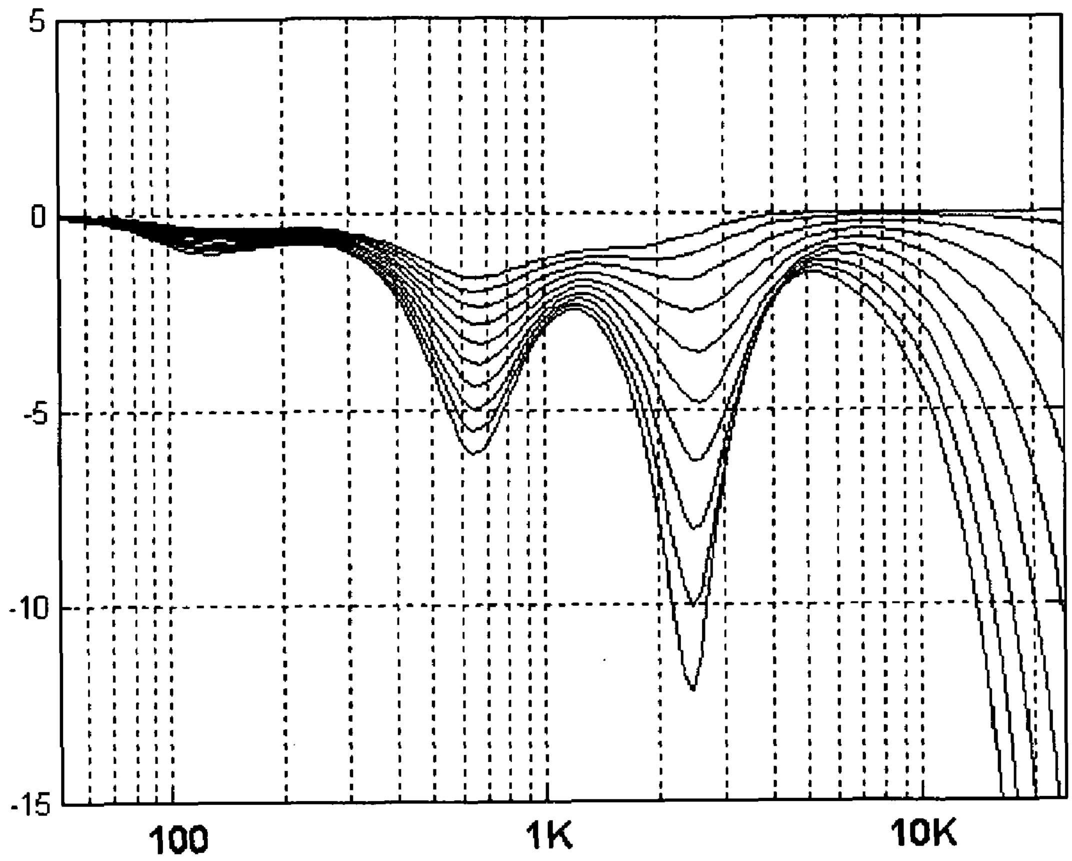
FIG. 3 Prior Art
FIG. 3 illustrates the resulting frequency responses, at vertical displacement angles 0 . . . 45 degrees in 5 degree steps, simulated positive upwards relative to the main axis which is perpendicular to x=0 of the loudspeaker of FIG. 1 using the crossover filters of FIG. 2.
Figure 4:
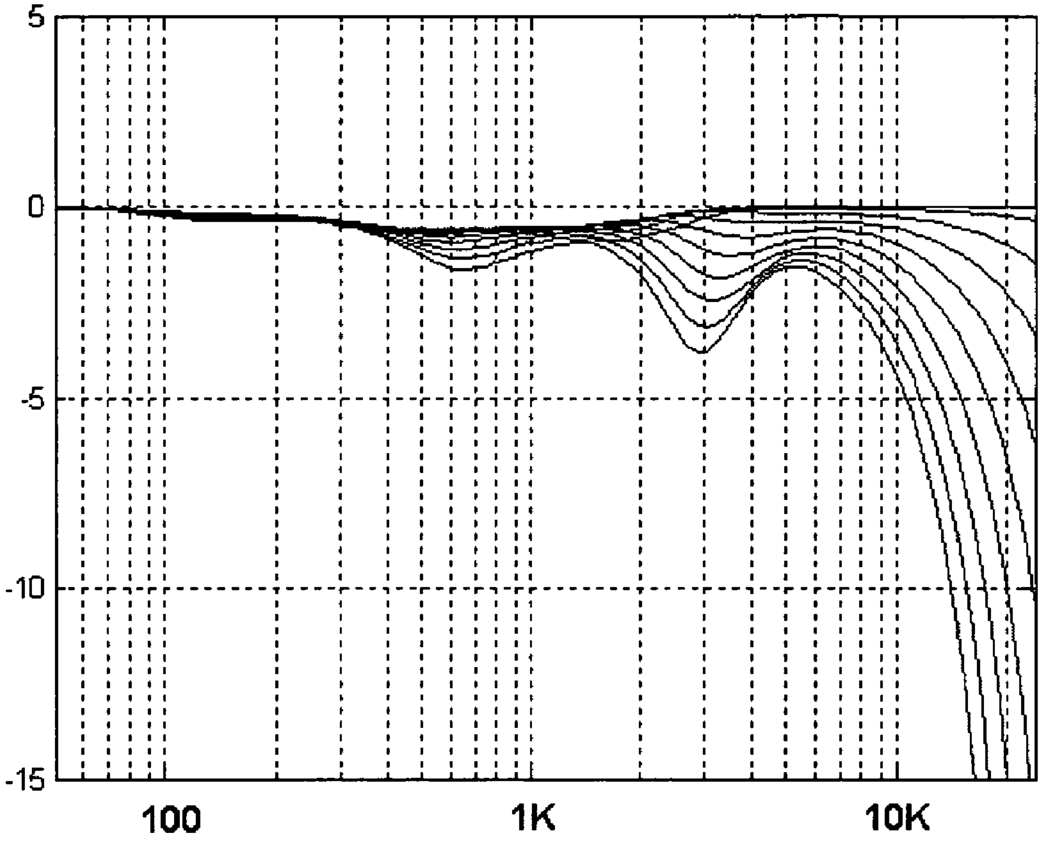
FIG. 4 Prior Art
FIG. 4 illustrates the resulting frequency responses, at vertical displacement angles 0 . . . 45 degrees in 5 degree steps, simulated negative downwards relative to the main axis which is perpendicular to x=0 of the loudspeaker of FIG. 1 using the crossover filters of FIG. 2.
Figure 5:
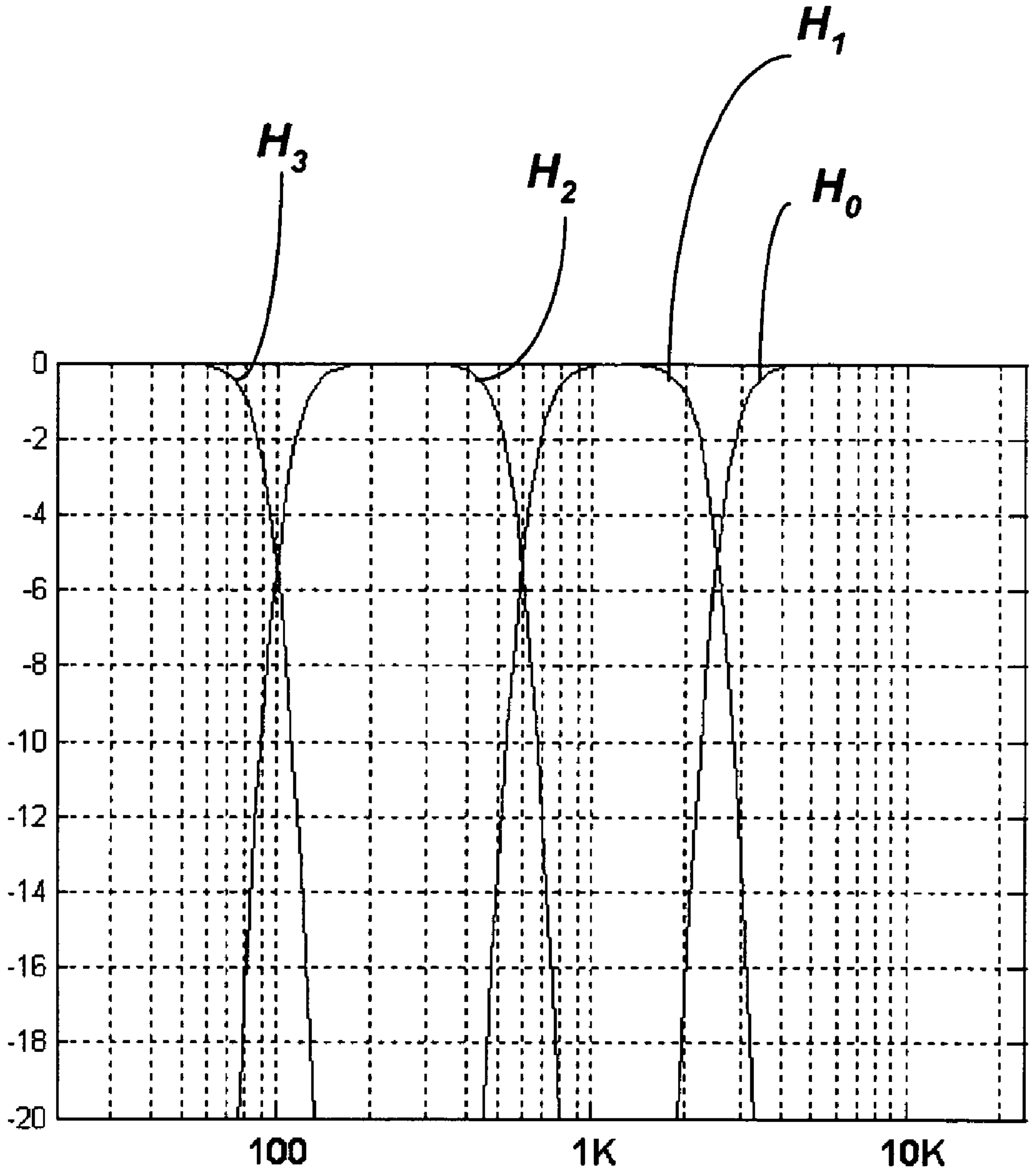
FIG. 5 Prior Art
FIG. 5 illustrates the frequency responses of prior art $4^{th}$ order "Chebychev Notched" crossover filters $H_0, \ldots, H_3$ with a stopband attenuation of 30 db and flat passband employed in the prior art loudspeaker of FIG. 1.
Figure 6:
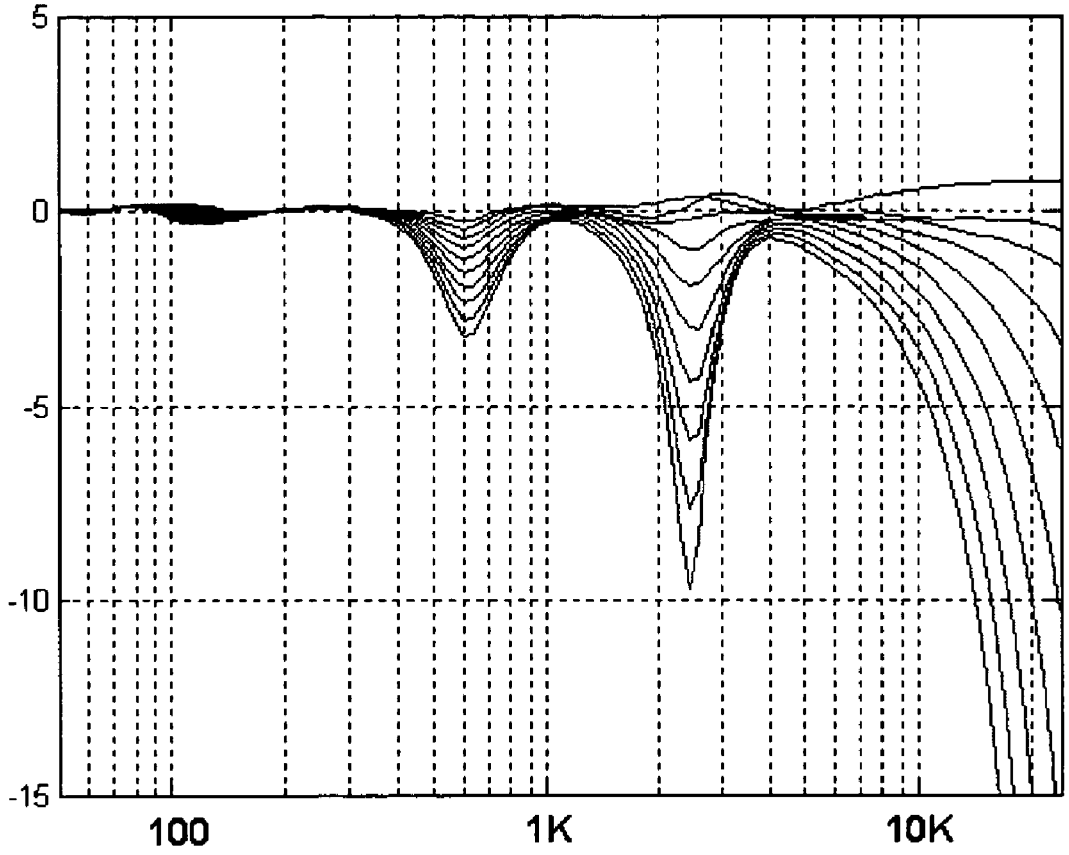
FIG. 6 Prior Art
FIG. 6 illustrates the resulting frequency responses, at vertical displacement angles 0 . . . 45 degrees in 5 degree steps, simulated positive upwards relative to the main axis which is perpendicular to x=0.
Figure 7:
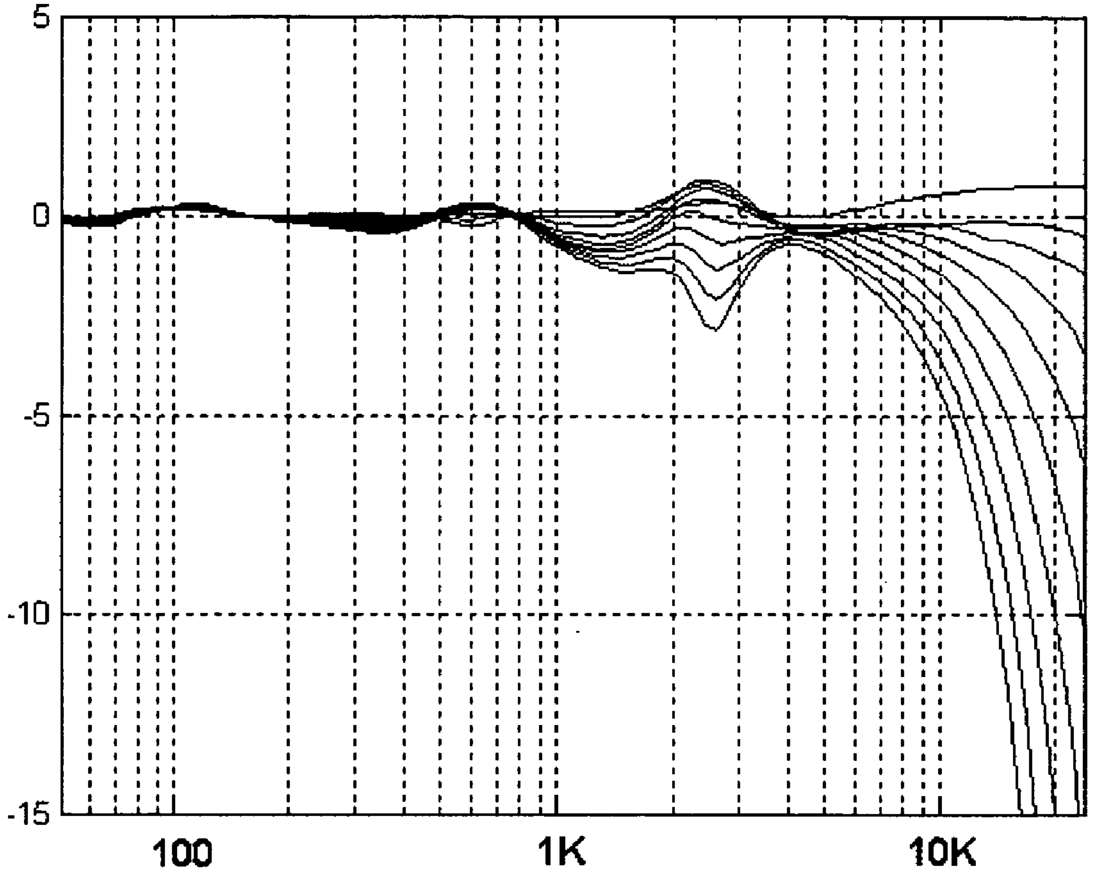
FIG. 7 Prior Art
FIG. 7 illustrates the resulting frequency responses, at vertical displacement angles 0 . . . 45 degrees in 5 degree steps, simulated negative downwards relative to the main axis which is perpendicular to x=0.
Figure 8:
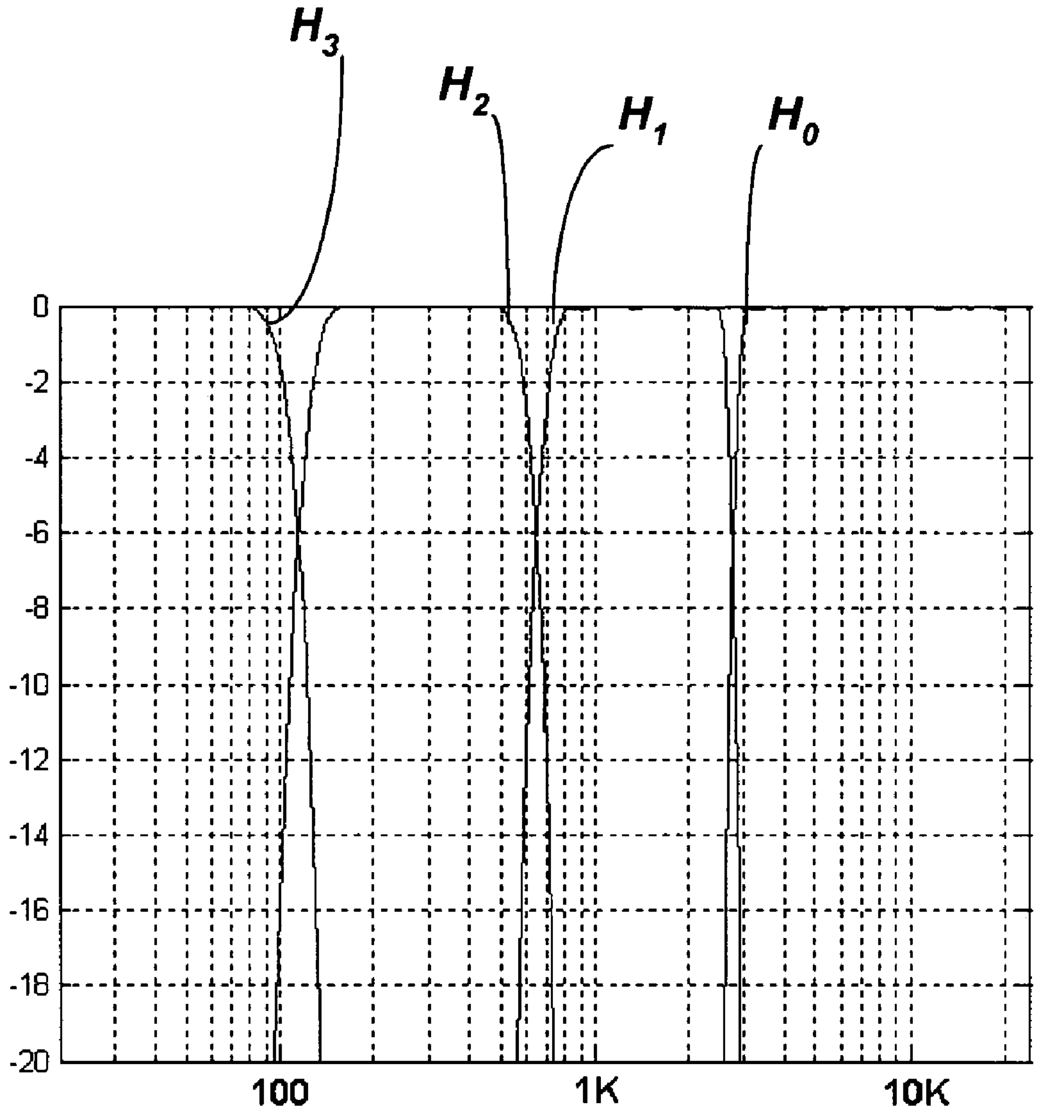
FIG. 8 Prior Art
FIG. 8 illustrates the frequency responses of digital, liner phase FIR filters $H_0, \ldots, H_3$ with very narrow transition bands employed in the prior art loudspeaker of FIG. 1.
Figure 9:
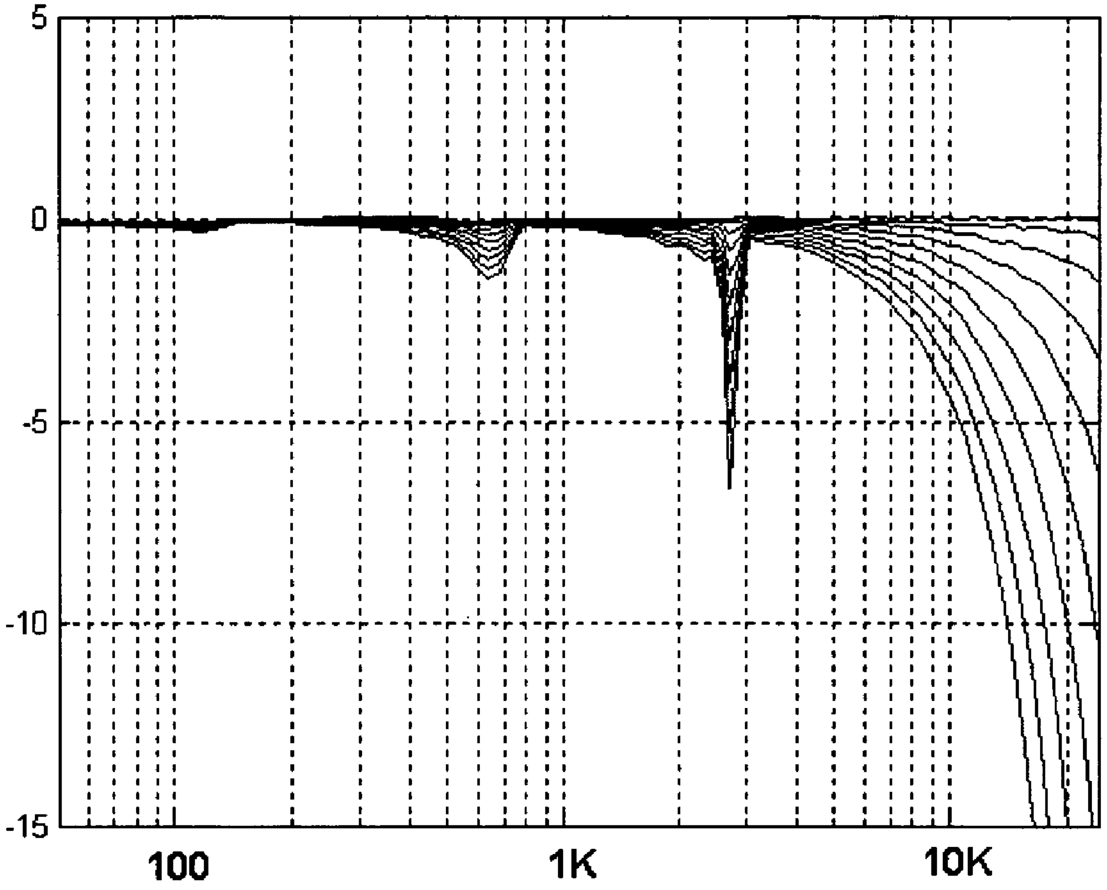
FIG. 9 Prior Art
FIG. 9 which illustrates the simulated acoustic far field frequency responses at vertical angles 0 . . . 45 degrees in 5 degree steps, upwards and downwards with respect to tweeter axis, using crossover filters of FIG. 8.
Figure 10:
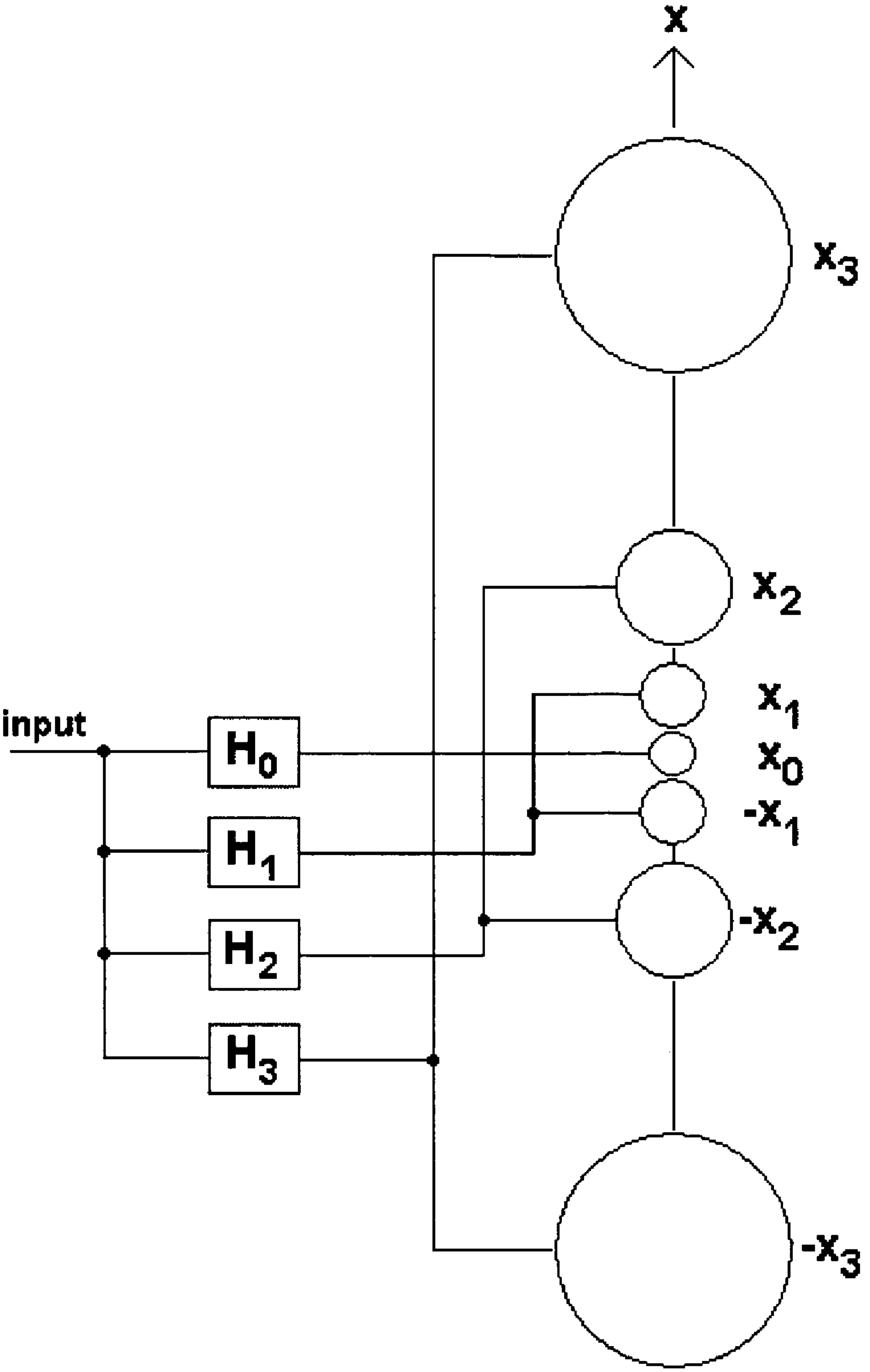
FIG. 10 Prior Art
FIG. 10 is an example of a prior art four-way loudspeaker system with crossover filters $H_0, \ldots, H_3$ and driver coordinates $x_0$, $+/-x_1$, $+/-x_2$, $+/-x_3$, drivers arranged pairwise symmetrically with respect to center tweeter.
Figure 11:
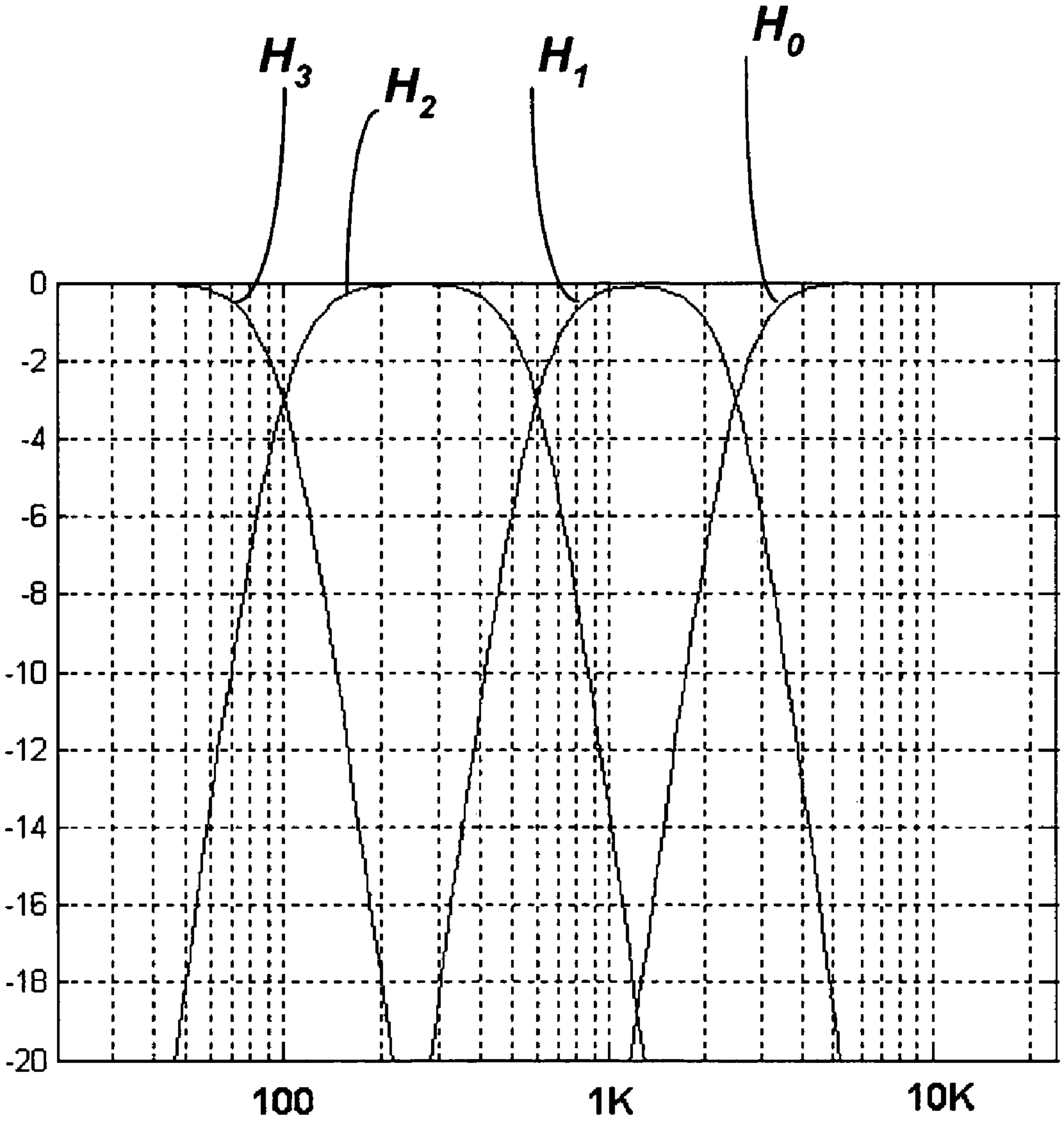
FIG. 11 Prior Art
FIG. 11 illustrates the frequency responses of the crossover filters $H_0, \ldots, H_3$ using $3^{rd}$ order Butterworth crossover filters as suggested by d'Appolito with the symmetric arrangement illustrated in FIG. 11.
Figure 12:
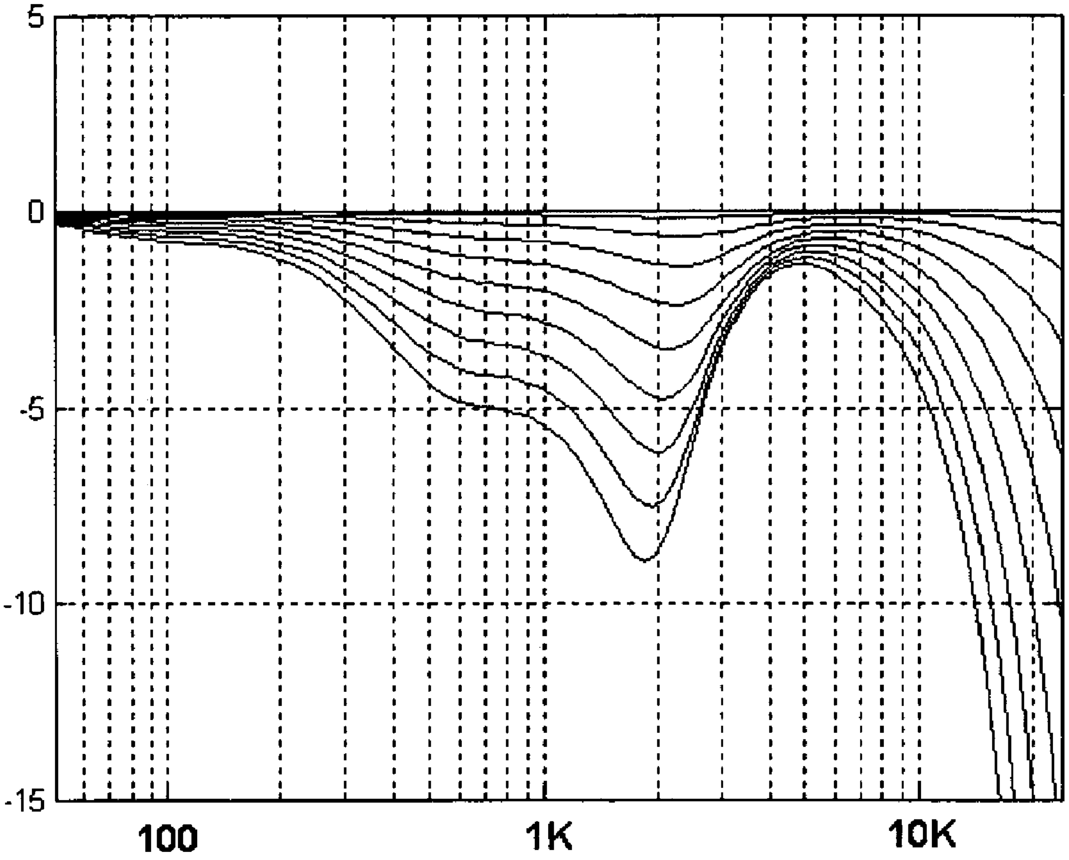
FIG. 12 Prior Art
FIG. 12 illustrates the simulated acoustic far field frequency responses at vertical angles 0 . . . 45 degrees in 5 degree steps, upwards and downwards with respect to tweeter axis, using loudspeaker system of FIG. 10 and crossover filters of FIG. 11.
Figure 23:
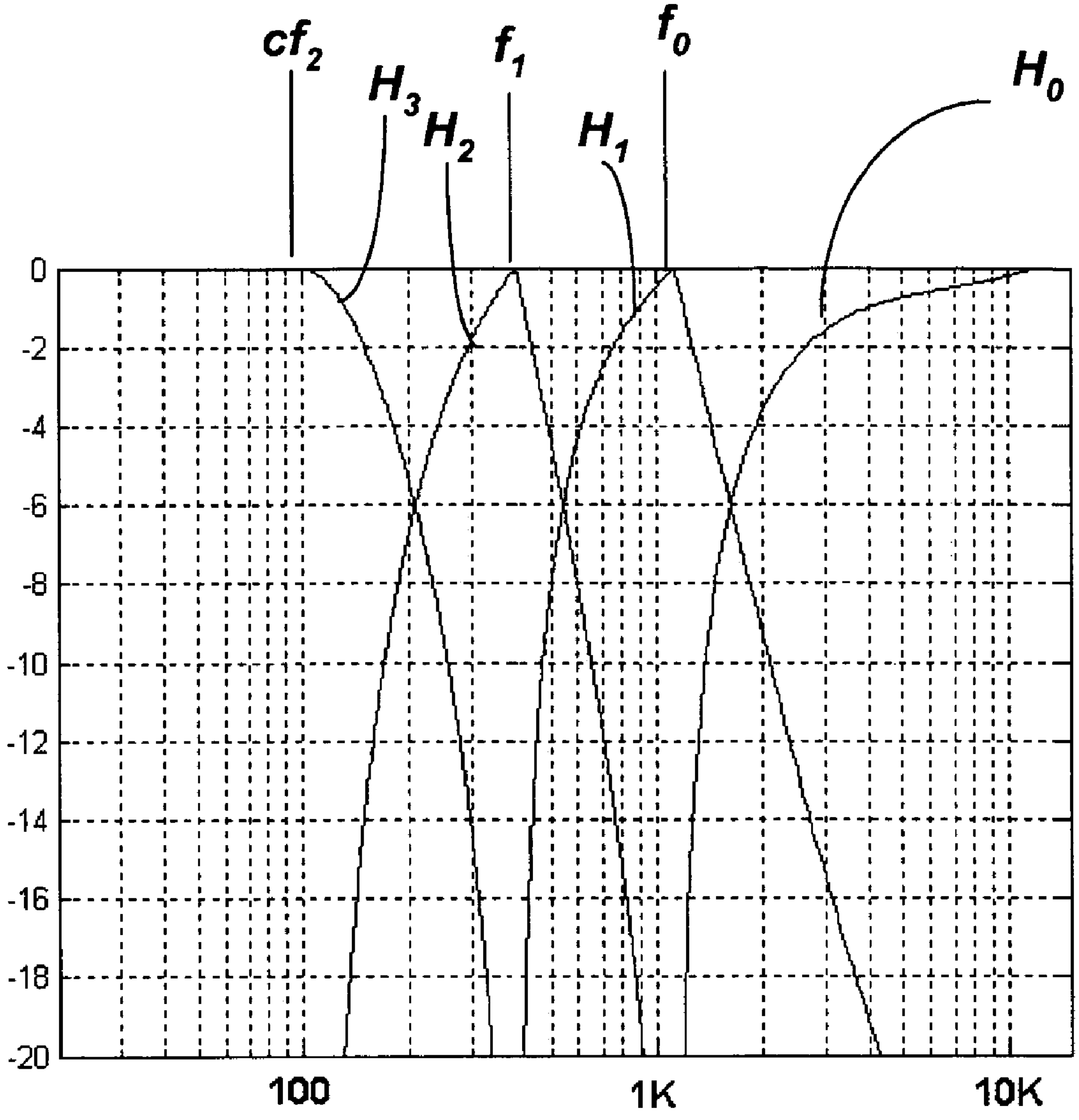
FIG. 23 illustrates the frequency responses of a four-way digital, FIR linear phase crossover filter bank according to one example implementation of the invention.

In an application with n ways, where n=4 using the loudspeaker depicted in FIG. 10 as an example, there are n−1 crossover frequencies $f_0 \ldots f_{n-2}$ or three crossover frequencies. FIG. 23 illustrates the three crossover frequencies of the filters for the loudspeaker depicted in FIG. 10. The first or low frequency band occurs below the crossover frequency point $f_1$ and is processed by the filter $H_3$ of FIG. 10. The second or intermediate frequency band occurs between the crossover frequency point $cf_2$ and the crossover frequency point $f_0$ which is processed by the filter $H_2$ of FIG. 10, while the third frequency band occurs above the crossover frequency point $f_1$ which is processed by $H_1$ of FIG. 10. Finally, the last frequency band occurs above the crossover frequency point $f_0$ which is processed by $H_0$ of FIG. 10.

Figure 24:
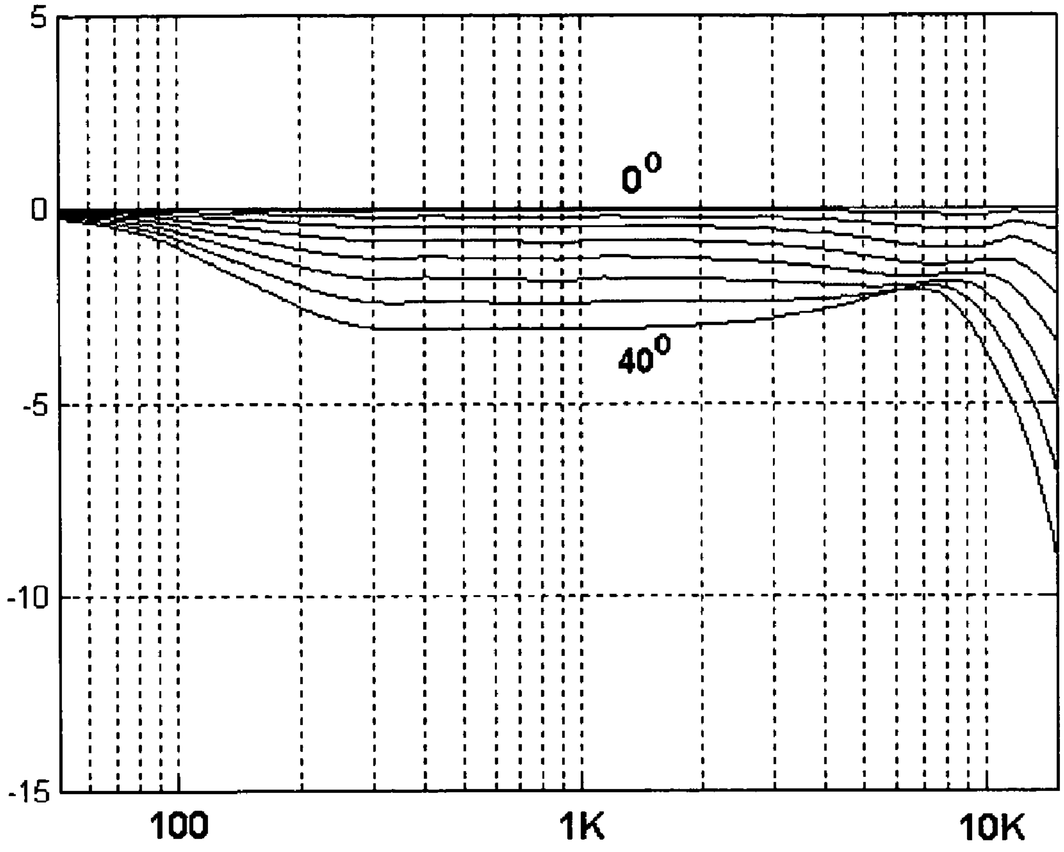
FIG. 24 illustrates the simulated acoustic far field frequency responses at vertical angles 0 . . . 40 degrees in 5 degree steps, upwards and downwards with respect to tweeter axis, using a six-way loudspeaker system using the crossover filters of FIG. 23.

FIG. 24 illustrates the simulated acoustic far field frequency responses at vertical angles 0 . . . 40 degrees in 5 degree steps, upwards and downwards with respect to tweeter axis, using loudspeaker system of FIG. 10 and crossover filters of FIG. 23. As shown in FIG. 24, the FIR filters of the loudspeaker in FIG. 10, having coefficients designed in accordance with the above described methodologies yield nearly constant directivity characteristics of the loudspeaker system, as desired.

Figure 25:
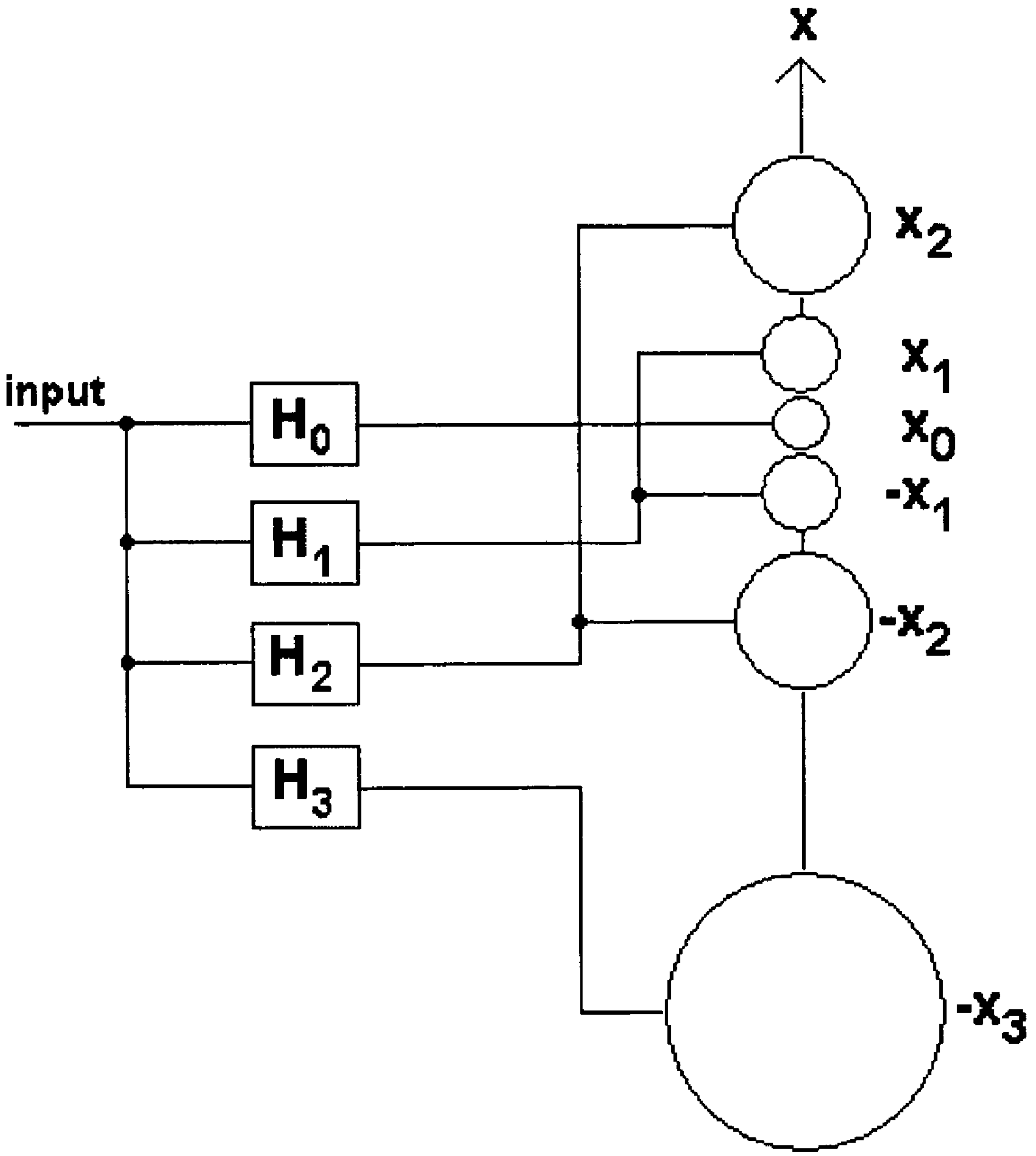
FIG. 25 illustrates an asymmetric loudspeaker array having a four-way loudspeaker system with crossover filters $H_0, \ldots, H_3$, drivers pair wise symmetrically arranged with respect to center tweeter, except with only woofer located at coordinate $-x_3$.
Figure 26:
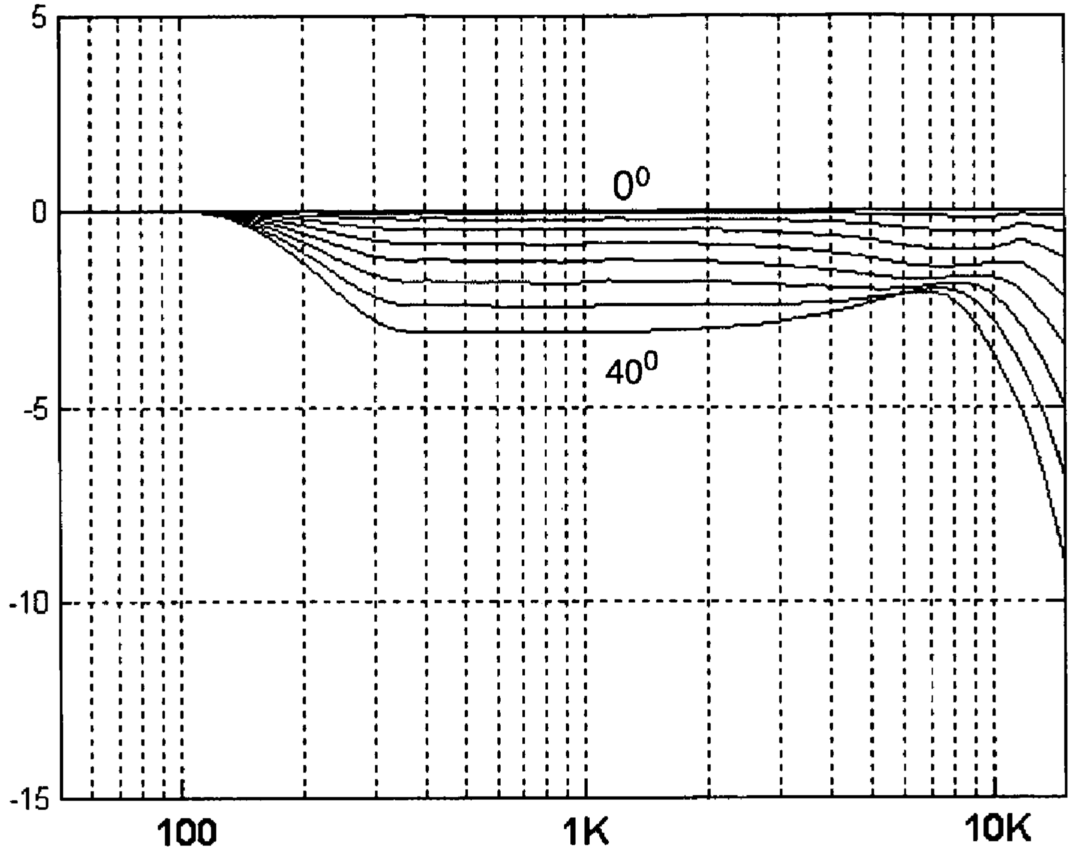
FIG. 26 illustrates the simulated acoustic far field frequency responses at vertical angles 0 . . . 40 degrees in 5 degree steps, upwards and downwards with respect to tweeter axis, using the loudspeaker system of FIG. 25 and crossover filters of FIG. 23.

Similarly, FIG. 25 illustrates an asymmetric version of the 4-way example of FIG. 10 using the crossover frequencies of FIG. 23 such that the crossover filters are designed according to the method as described above and kept unchanged. The single woofer is amplified by a scaling factor two, to keep the output at low frequencies constant. The resulting frequency responses are shown in FIG. 26. A comparison of FIG. 24 and FIG. 26 shows that the frequency responses remain unchanged above a defined frequency point. Below the threshold where the system becomes directive is higher due to the reduced length compared with wavelength. We have therefore shown that an asymmetric truncation of the loudspeaker array, as designed with the disclosed method, is possible, and can be applied to any kind of conventional multi-way loudspeaker.

The above described example method for calculating cross over frequencies may also be applied to a loudspeaker with n ways where n=2. As before, the initial parameters for the coordinate pair are prescribed. The attenuation factor a and angle $\alpha$ are also chosen, as set forth in FIG. 14 step 1406. Once the initial parameters for the coordinates of the drivers and the attenuation factor a and angle $\alpha$ are chosen, as set forth in FIG. 14 step 1406, the crossover frequency $f_0$ is computed, using Equation 5. Then, measure or modeled data may be used, as described above, to determine frequency coefficient for the high frequency filter.

Figure 27:
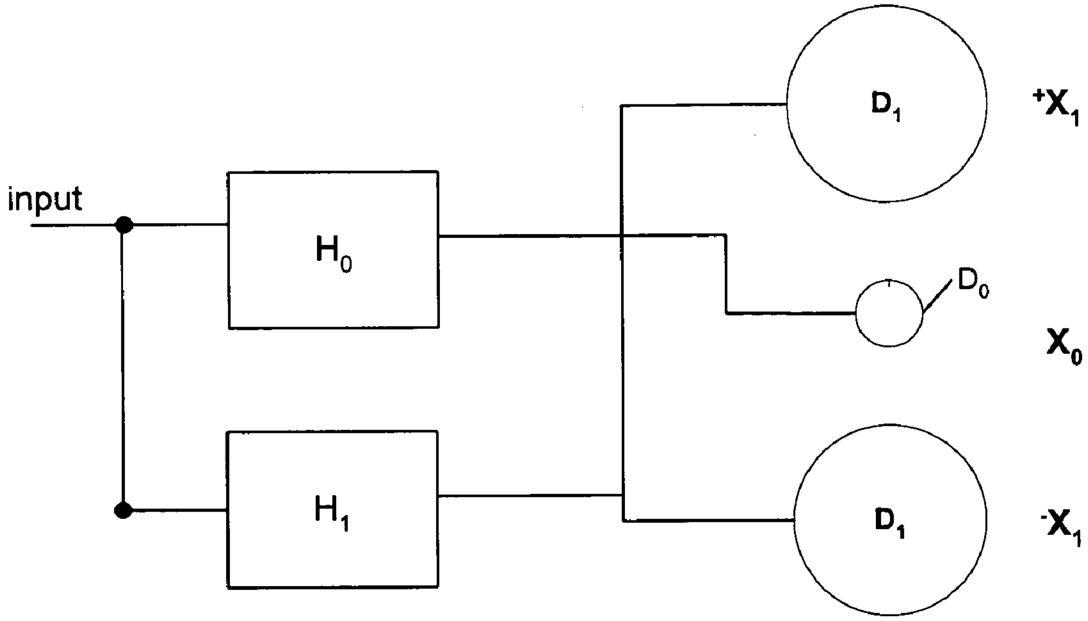
FIG. 27 is an example of a two-way loudspeaker system.

FIG. 27 illustrates an example of one two-way loudspeaker having a tweeter in the origin and a pair of woofers at +/−7 cm (X=0.07). The attenuation parameter is a=0.6 at the angle $\alpha$=55. Resulting crossover frequency is $f$=891 Hz.

Figure 28:
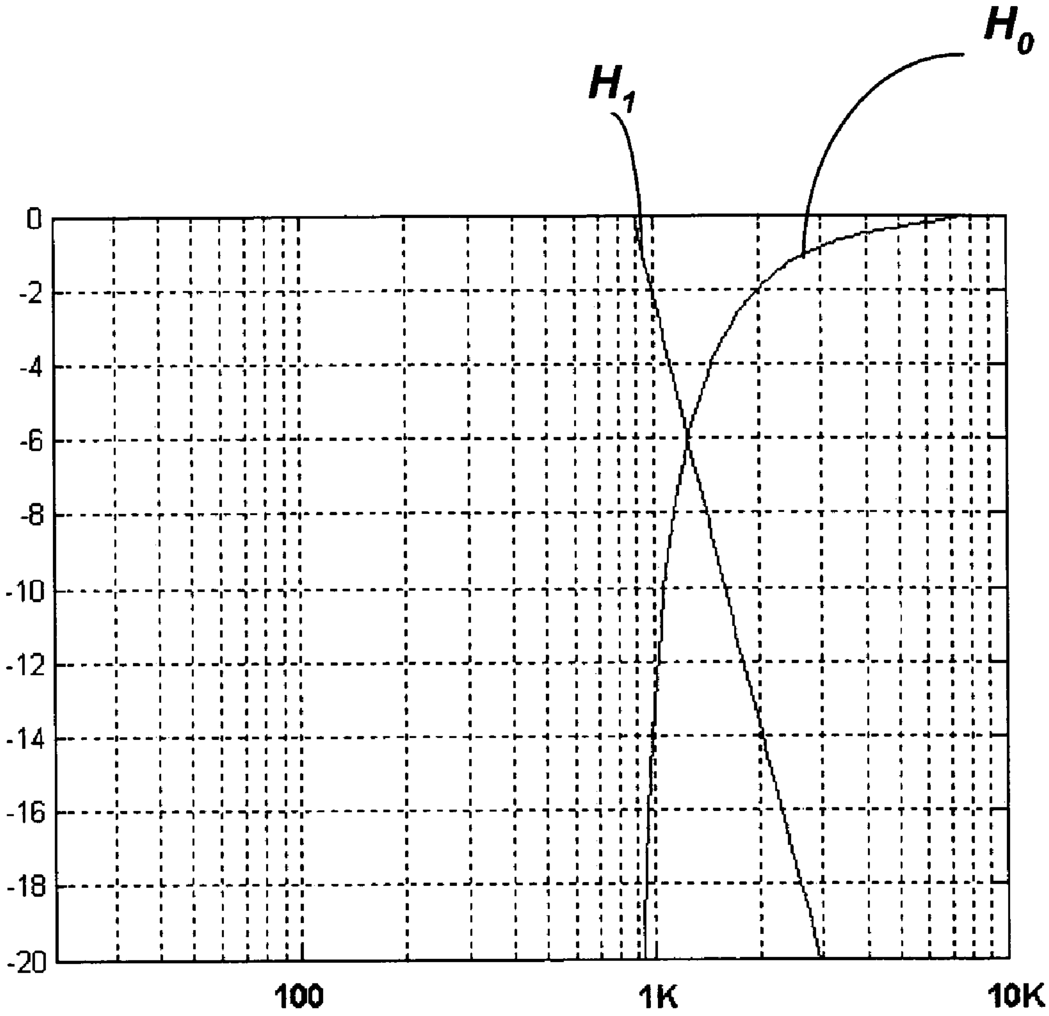
FIG. 28 illustrates the frequency responses of a two-way digital, FIR linear phase crossover filter bank according to one example implementation of the invention.
Figure 29:
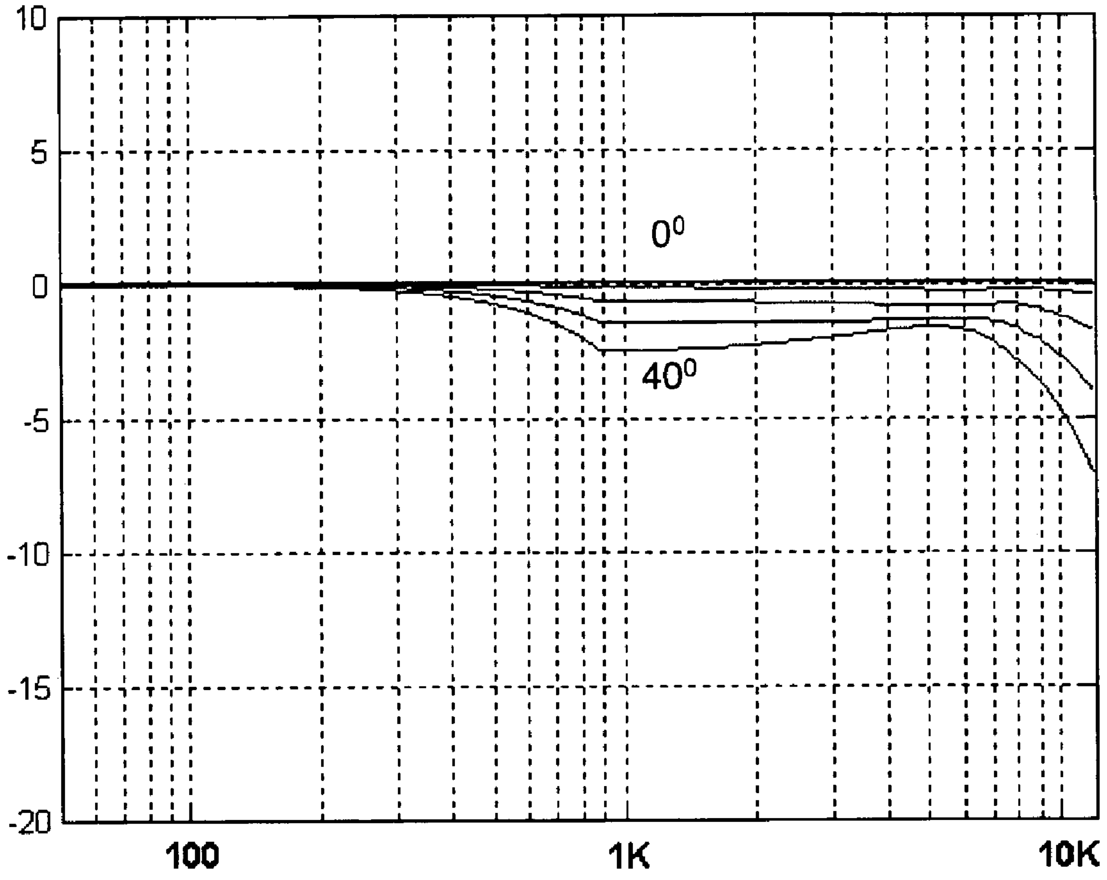
FIG. 29 illustrates the simulated acoustic far field frequency responses at vertical angles 0 . . . 40 degrees in 5 degree steps, upwards and downwards with respect to tweeter axis, using a two-way loudspeaker system using the crossover filters of FIG. 28.

FIG. 28 illustrates the crossover frequencies of the filters for the loudspeaker depicted in FIG. 27. Using the loudspeaker depicted in FIG. 27 as an example, there are n−1 crossover frequencies $f_0 \ldots f_{n-2}$ or one crossover frequency. FIG. 29 illustrates the simulated acoustic far field frequency responses at vertical angles 0 . . . 40 degrees in 5 degree steps, upwards and downwards with respect to tweeter axis, using loudspeaker system of FIG. 27 and crossover filters of FIG. 28. As shown in FIG. 28, the FIR filters of the loudspeaker in FIG. 27, having coefficients designed in accordance with the above described methodologies, yield nearly constant directivity characteristics of the loudspeaker system, as desired.

The foregoing description of an implementation has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed is:

1. A method for computing frequency responses of crossover filters for multi-way loudspeakers, the method comprising prescribing driver coordinates for drivers in the multi-way loudspeaker;

prescribing an attenuation function for the sound pressure level at a desired angle;

computing crossover frequencies with a processor using a point source model; and computing the frequency responses in intervals defined by the crossover frequencies with the processor, where the frequency response of the interval between a lowest crossover frequency point and a highest crossover frequency point is computed before the frequency responses associated with either an interval below the lowest crossover frequency or an interval above the highest crossover frequency.

2. The method of claim 1 further comprising determining the filter coefficients for the crossover filters using frequency sampling.

3. The method of claim 1 where the prescribed attenuation function for sound pressure is set to a constant attenuation factor for determining crossover frequencies in the midrange frequency band.

4. The method of claim 1 where a frequency dependent attenuation function is established for computing crossover frequencies and frequency responses in the low frequency band through the construction of a transition band.

5. The method of claim 1 where measured data is used to computing crossover frequencies and frequency responses in the high frequency band.

6. The method of claim 1 where a pistonic membrane model is used to computing crossover frequencies and frequency responses in the high frequency band.

7. The method of claim 1 where the method is applied to a multi-way loudspeakers having symmetrically configured drivers about the point of origin defined by the position of the center driver.

8. The method of claim 1 where the method is applied to a multi-way loudspeakers having non-symmetrically configured drivers about the point of origin defined by the position of the center driver.

9. The method of claim 1 where the method is applied to a multi-way loudspeaker that includes at least two different driver types.

10. The method of claim 1 where the multi-way loudspeaker includes at least three different driver types.

11. The method of claim 1 where the loudspeaker includes at least one pair of drivers positioned above center.

12. The method of claim 8 where the loudspeaker includes at least one pair of drivers positioned about center.

13. A method for computing frequency responses of crossover filters for multi-way loudspeakers, the method comprising prescribing driver coordinates for drivers in the multi-way loudspeaker;

prescribing an attenuation function for the sound pressure level at a desired angle;

computing crossover frequencies with a processor in the midrange frequency band by setting the attenuation function to a constant attenuation factor and using a point source model; and computing the frequency responses in intervals defined by the crossover frequencies with the processor for all frequency bands whereby measured or modeled data is used to compute crossover frequencies and frequency responses in at least the high frequency band, with the frequency response of the interval between a lowest crossover frequency point and a highest crossover frequency point being computed before either frequency responses associated with an interval below the lowest crossover frequency or an interval above the highest crossover frequency.

14. The method of claim 13 where the method is applied to a multi-way loudspeakers having symmetrically configured drivers about the point of origin defined by the position of the center driver.

15. The method of claim 13 where the method is applied to a multi-way loudspeakers having non-symmetrically configured drivers about the point of origin defined by the position of the center driver.

16. The method of claim 13 where the method is applied to a multi-way loudspeaker that includes at least two different drivers.

17. The method of claim 13 where the multi-way loudspeaker that includes at least three different drivers.

18. The method of claim 13 where the loudspeaker includes at least one pair of drivers positioned about center.

19. The method of claim 16 where the loudspeaker includes at least one pair of drivers positioned about center.

* * * * *